(12) United States Patent
Ishikawa et al.

(10) Patent No.: US 11,469,111 B2
(45) Date of Patent: Oct. 11, 2022

(54) SUBSTRATE PROCESSING METHOD AND PLASMA PROCESSING APPARATUS

(71) Applicant: TOKYO ELECTRON LIMITED, Tokyo (JP)

(72) Inventors: Shinya Ishikawa, Miyagi (JP); Toru Hisamatsu, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/039,295

(22) Filed: Sep. 30, 2020

(65) Prior Publication Data

US 2021/0098263 A1 Apr. 1, 2021

(30) Foreign Application Priority Data

Oct. 1, 2019 (JP) .............................. JP2019-181500

(51) Int. Cl.
*H01L 21/311* (2006.01)
*H01L 21/027* (2006.01)
*H01J 37/32* (2006.01)

(52) U.S. Cl.
CPC .. *H01L 21/31138* (2013.01); *H01J 37/32449* (2013.01); *H01L 21/0271* (2013.01); *H01J 2237/3341* (2013.01)

(58) Field of Classification Search
None
See application file for complete search history.

(56) References Cited

U.S. PATENT DOCUMENTS

| 2004/0029052 | A1 | 2/2004 | Park et al. |
| 2016/0268141 | A1* | 9/2016 | Hudson ............. H01L 21/31144 |
| 2016/0379834 | A1* | 12/2016 | Katsunuma ........... H01L 21/308 438/720 |
| 2021/0082713 | A1* | 3/2021 | Katsunuma ....... H01L 21/31144 |

FOREIGN PATENT DOCUMENTS

JP 2004-080033 A 3/2004

* cited by examiner

*Primary Examiner* — Jiong-Ping Lu
(74) *Attorney, Agent, or Firm* — Weihrouch IP

(57) ABSTRACT

A method for processing a substrate for processing a substrate includes: (a) providing a substrate having an etching region and a patterned region on the etching region; (b) forming an organic film on a surface of the substrate; and (c) etching the etching region using plasma generated from a processing gas through the patterned region. The step (b) includes (b1) supplying a first gas containing an organic compound to the substrate to form a precursor layer on the substrate, and (b2) supplying a second gas containing a modifying gas to the substrate and supplying energy to the precursor layer and/or the second gas to modify the precursor layer.

16 Claims, 14 Drawing Sheets

SUBSTRATE PROCESSING METHOD AND PLASMA PROCESSING APPARATUS

CROSS-REFERENCE TO RELATED APPLICATION

This application is based on and claims priority from Japanese Patent Application No. 2019-181500 filed on Oct. 1, 2019 with the Japan Patent Office, the disclosure of which is incorporated herein in its entirety by reference.

TECHNICAL FIELD

The present disclosure relates to a method for processing a substrate and an apparatus for processing plasma.

BACKGROUND

In manufacturing an electronic device, a fine pattern may be formed by etching. Japanese Patent Laid-Open Publication No. 2004-080033 discloses a method of forming a fine pattern using a silicon oxide film. The method disclosed in Japanese Patent Laid-Open Publication No. 2004-080033 forms a photoresist pattern on a material film on which a fine pattern is to be formed, and deposits a silicon oxide film on the photoresist pattern. The silicon oxide film is conformally and thinly formed without damaging a lower photoresist pattern. A dry etching is then performed on a lower film. In the dry etching, a spacer is initially formed on a side wall of the photoresist pattern, and then a polymer film is formed on the photoresist pattern.

SUMMARY

In an embodiment, a method for processing a substrate is provided. The method includes step (a), step (b), and step (c). The step (a) is a step of providing a substrate having an etching region and a patterned region on the etching region. The step (b) is a step of forming an organic film on the surface of a substrate. The step (c) is a step of etching the etching region using plasma generated from a processing gas through the patterned region. The step (b) includes step (b1) and step (b2). The step (b1) is a step of supplying a first gas containing an organic compound to the substrate to form a precursor layer on the substrate. The step (b2) is a step of supplying a second gas containing a modifying gas to the substrate and supplying energy to the precursor layer and/or the second gas to modify the precursor layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
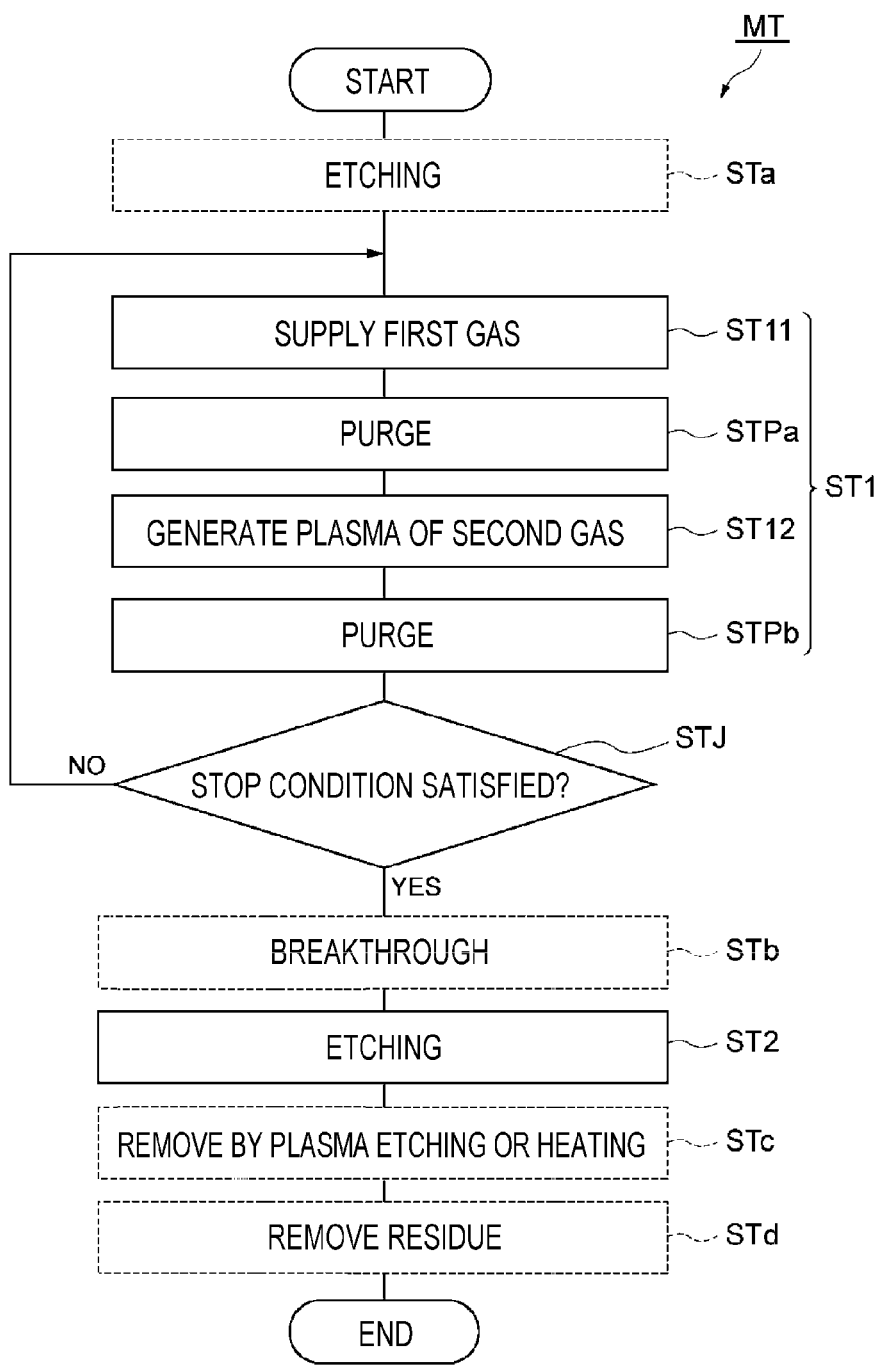
FIG. 1 is a flowchart according to an embodiment of a substrate processing method.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In manufacturing an electronic device, a technique of combining film formation and etching is used for CD control, as a protective film and a sacrificial film. In the film formation, a film with high selectivity and resistance to combined etching is required. Further, with the miniaturization of devices, a fine shape is required for etching. As described above, a technique capable of controlling film formation and etching at an atomic layer level is required to be developed. Hereinafter, various embodiments will be described.

In an embodiment, a method for processing a substrate is provided. The method includes step (a) and step (b). The step (a) is a step of providing a substrate having an etching region and a patterned region on the etching region. The step (b) is a step of forming an organic film on the surface of a substrate. The step (b) includes step (b1) and step (b2). The step (b1) is a step of supplying a first gas containing an organic compound to the substrate to form a precursor layer on the substrate. The step (b2) is a step of supplying a second gas containing a modifying gas to the substrate and supplying energy to the precursor layer and/or the second gas to modify the precursor layer.

In the embodiment, in the step (b2), the precursor layer is modified by plasma generated from the second gas.

In the embodiment, the steps (b1) and (b2) are alternately repeated.

In the embodiment, the method for processing a substrate further includes step (d). The step (d) is a step of etching the organic film on the etching region such that the organic film is left at a portion along the side surface of the patterned region before the step (c).

In the embodiment, the method for processing a substrate further includes step (e). The step (e) is a step of forming a recess by partially etching the etching region through the patterned region by using the plasma generated from the processing gas before the step (b). In the step (b), the organic film is formed at least on a side surface of the recess, and in the step (c), a bottom of the recess in the etching region is etched.

In the embodiment, the precursor layer is not formed on a portion of the surface of the recess in the step (b1) and/or the precursor layer is not modified on a portion of the surface of the recess in the step (b2).

In the embodiment, the organic film has a different thickness along the thickness direction of the substrate.

In the embodiment, the method for processing a substrate further includes step (f). The step (f) is a step of trimming the organic film after the step (b). The etching region is surrounded by the side surface of the patterned region. In the step (b), the organic film is formed on the side surface to have a different thickness along the thickness direction of the substrate.

In the embodiment, the method for processing a substrate further includes step (g). The step (g) is a step of forming a conformal organic film on the entire surface before the step (b).

In the embodiment, the first gas contains at least one organic compound selected from the group consisting of epoxides, carboxylic acids, carboxylic acid halides, carboxylic acid anhydrides, isocyanates, and phenols.

In the embodiment, the second gas contains at least one modifying gas selected from the group consisting of an inorganic compound gas having an NH bond, an inert gas, a mixed gas of $N_2$ and $H_2$, a $H_2O$ gas, and a mixed gas of $H_2$ and $O_2$.

In the embodiment, when the first gas contains at least one organic compound selected from the group consisting of carboxylic acids, carboxylic acid halides, and isocyanates, the second gas contains at least one modifying gas selected from the group consisting of gases below. Such a group of gases includes an inorganic compound gas having an NH bond, an inert gas, a mixed gas of $N_2$ and $H_2$, a $H_2O$ gas, and a mixed gas of $H_2$ and $O_2$.

In the embodiment, when the first gas contains at least one organic compound selected from the group consisting of epoxides, carboxylic acid halides, and phenols, the second gas contains at least one modifying gas selected from the group consisting of gases below. Such a group of gases includes an inorganic compound gas having an NH bond, an inert gas, and a mixed gas of $N_2$ and $H_2$.

In the embodiment, the inorganic compound gas having an NH bond is at least one selected from the group consisting of $N_2H_2$, $N_2H_4$, and $NH_3$.

In the embodiment, the etching region contains a silicon-containing film.

In the embodiment, a step of forming the organic film and a step of etching are performed in the same processing chamber (in-situ) or the same system (in-system) while maintaining a reduced pressure atmosphere.

In an embodiment, a method for processing a substrate is provided. The method includes step (a), step (b), and step (c). The step (b) includes (b1) supplying a first gas containing an organic compound into the processing chamber to form a precursor layer on the substrate, and (b2) supplying a second gas containing a modifying gas into the processing chamber and supplying energy to at least one of the precursor layer and the second gas to modify the precursor layer.

In an embodiment, an apparatus for processing plasma is provided. The apparatus includes one or more processing chambers, a plasma generator, and a controller. In one or more processing chambers, at least one processing chamber is designed or configured to perform etching, at least one processing chamber is designed or configured to perform deposition, and each reaction chamber has a gas inlet and a gas outlet. The controller is configured to cause (a) providing a substrate having an etching region and a patterned region on the etching region in the processing chamber, (b) forming an organic film on a surface of the substrate, and (c) etching the etching region using plasma generated from a processing gas through the patterned region Various embodiments will now be described in detail with reference to the accompanying drawings. Further, in the respective drawings, the same or corresponding parts will be denoted by the same symbols.

Figure 2:
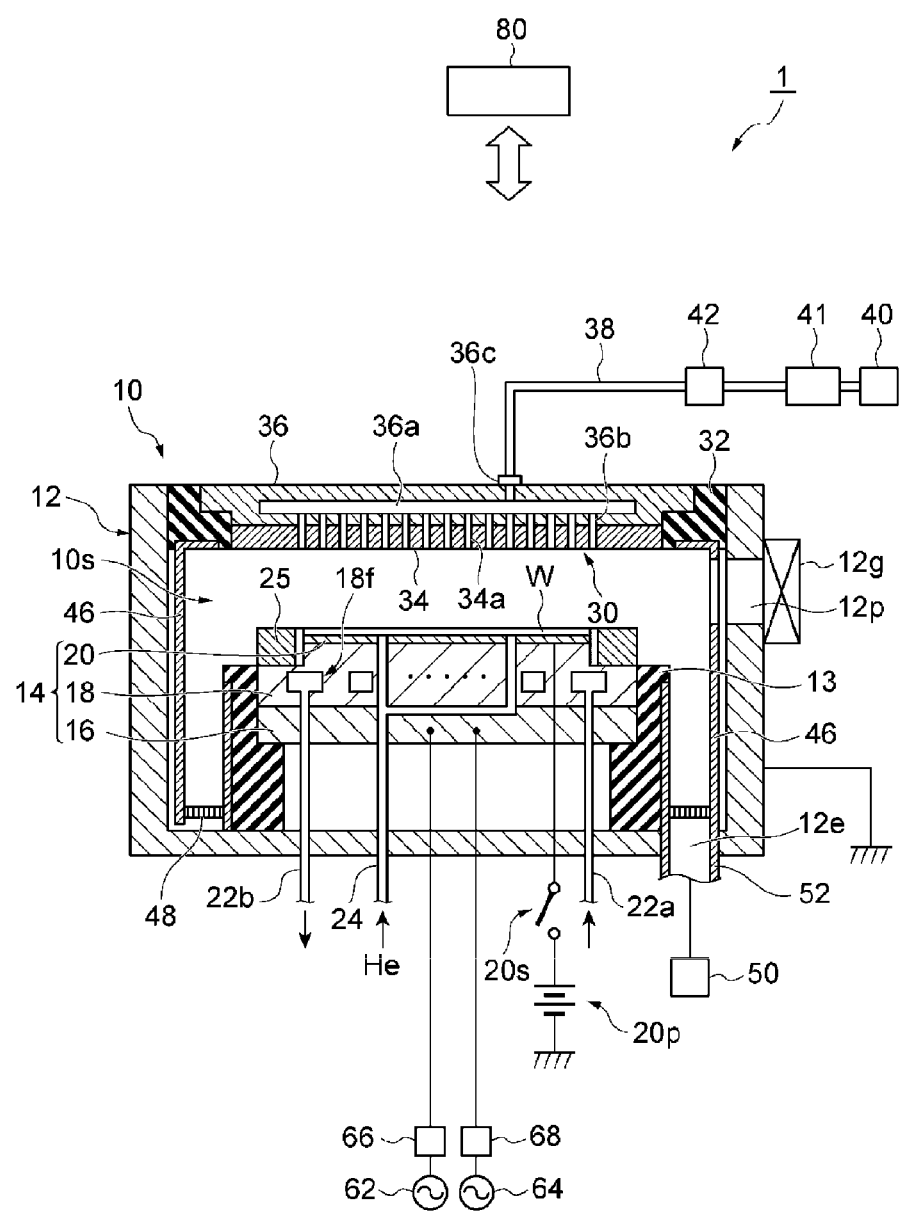
FIG. 2 is a diagram schematically illustrating a plasma processing apparatus that may be used in the flowchart illustrated in FIG. 1.

The flowchart illustrated in FIG. 1 represents an embodiment of a substrate processing method (hereinafter, referred to as a method MT). The method MT is performed using, for example, a plasma processing apparatus illustrated in FIG. 2.

The plasma processing apparatus 1 includes a chamber 10. The chamber 10 provides an internal space 10s therein. The chamber 10 includes a chamber body 12. The chamber body 12 has a substantially cylindrical shape. The chamber body 12 is formed of, for example, aluminum. A film having corrosion resistance is provided on the inner wall surface of the chamber body 12. The film may be a ceramic such as aluminum oxide or yttrium oxide.

A passage 12p is formed in the side wall of the chamber body 12. A substrate W passes through the passage 12p when being transferred between the internal space 10s and the outside of the chamber 10. The passage 12p is opened and closed by a gate valve 12g provided along the side wall of the chamber body 12.

A support 13 is provided on the bottom of the chamber body 12. The support 13 is formed of an insulating material. The support 13 has a substantially cylindrical shape. The support 13 extends upward from the bottom of the chamber body 12 in the internal space 10s. The support 13 has a support stage 14 on the upper portion. The support stage 14 is configured to support the substrate W in the internal space 10s.

The support stage 14 includes a lower electrode 18 and an electrostatic chuck 20. The support stage 14 further includes an electrode plate 16. The electrode plate 16 is formed of a conductive material such as, for example, aluminum and has a substantially disc shape. The lower electrode 18 is provided on the electrode plate 16. The electrode plate 18 is formed of a conductive material such as, for example, aluminum and has a substantially disc shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and electrodes. The main body of the electrostatic chuck 20 has a substantially disc shape and is formed of a dielectric material. The electrode of the electrostatic chuck 20 is a film-shaped electrode and is provided inside the main body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attractive force is generated between the electrostatic chuck 20 and the substrate W. Due to the generated electrostatic attraction, the substrate W is held by the electrostatic chuck 20.

An edge ring 25 is arranged on the peripheral portion of the lower electrode 18 to surround the edge of the substrate W. The edge ring 25 improves in-plane uniformity of plasma processing on the substrate W. The edge ring 25 may be formed of silicon, silicon carbide, or quartz.

A flow path 18f is formed in the lower electrode 18. A heat exchange medium (e.g., a coolant) is supplied to the flow path 18f from a chiller unit 22 (not illustrated) provided outside the chamber 10 via a pipe 22a. The heat exchange medium supplied to the flow path 18f is returned to the chiller unit 22 via a pipe 22b. In the plasma processing apparatus 1, the temperature of the substrate W placed on the electrostatic chuck 20 is adjusted by heat exchange between the heat exchange medium and the lower electrode 18.

A gas supply line 24 is provided in the plasma processing apparatus 1. The gas supply line 24 supplies a heat transfer gas (e.g., He gas) from a heat transfer gas supply mechanism between the upper surface of the electrostatic chuck 20 and the back surface of the substrate W.

The plasma processing apparatus 1 further includes an upper electrode 30. The upper electrode 30 is provided above the support stage 14. The upper electrode 30 is supported on the upper portion of the chamber body 12 via a member 32. The member 32 is formed of an insulating material. The upper electrode 30 and the member 32 close the upper opening of the chamber body 12.

The upper electrode 30 may include a top plate 34 and a support body 36. The lower surface of the top plate 34 is the lower surface on the side of the internal space 10s, and defines the internal space 10s. The top plate 34 may be formed of a low-resistance conductor or semiconductor that generates little Joule heat. The top plate 34 has a plurality of gas discharge holes 34a that penetrates the top plate 34 in the plate thickness direction.

The support body 36 detachably supports the top plate 34. The support body 36 is formed of a conductive material such as aluminum. A gas diffusion chamber 36a is provided inside the support body 36. The support body 36 has a plurality of gas holes 36b extending downward from the gas diffusion chamber 36a. The plurality of gas holes 36b communicate with the plurality of gas discharge holes 34a, respectively. A gas inlet 36c is formed in the support body 36. The gas inlet 36c is connected to the gas diffusion chamber 36a. A gas supply pipe 38 is connected to the gas inlet 36c.

A valve group 41, a flow rate controller group 42, and a gas source group 40 are connected to a gas supply pipe 38. The gas source group 40, the valve group 41, and the flow rate controller group 42 constitute a gas supply. The gas source group 40 is configured to supply a first gas GS2 containing an organic compound and a second gas to the internal space 10s. The gas source group 40 includes a plurality of gas sources. The valve group 41 includes a plurality of open/close valves. The flow rate controller group 42 includes a plurality of flow rate controllers. Each of the plurality of flow rate controllers in the flow rate controller group 42 is a mass flow controller or a pressure control type flow rate controller. Each of the plurality of gas sources of the gas source group 40 is connected to the gas supply pipe 38 via the corresponding open/close valve of the valve group 41 and the corresponding flow rate controller of the flow rate controller group 42.

In the plasma processing apparatus 1, a shield 46 is detachably provided along the inner wall surface of the chamber body 12 and the outer periphery of the support 13. The shield 46 prevents the etching by-product from adhering to the chamber body 12. The shield 46 is constituted by forming a film having corrosion resistance on the surface of a base material formed of, for example, aluminum. The film having corrosion resistance may be formed of a ceramic such as yttrium oxide.

A baffle plate 48 is provided between the support 13 and the side wall of the chamber body 12. The baffle plate 48 is constituted by forming a film having corrosion resistance (a film of yttrium oxide) on the surface of a base material formed of, for example, aluminum. A plurality of through holes is formed in the baffle plate 48. A gas outlet 12e is provided below the baffle plate 48 and at the bottom of the chamber body 12. A gas outlet 12e is connected to an exhaust device 50 via an exhaust pipe 52. The exhaust device 50 has a vacuum pump such as a pressure control valve or a turbo molecular pump.

The plasma processing apparatus 1 includes a first radio-frequency power supply 62 and a second radio-frequency power supply 64. The first radio-frequency power supply 62 is a power supply that generates a first radio-frequency power. The first radio-frequency power supply 62 is configured to supply a radio-frequency to the internal space 10s. The first radio-frequency power has, for example, a frequency suitable for plasma generation. The frequency of the first radio-frequency power is within the range of, for example, 27 MHz to 100 MHz. The first radio-frequency power supply 62 is connected to the lower electrode 18 via a matching device 66 and the electrode plate 16. The matching device 66 includes a circuit that matches the output impedance of the first radio-frequency power supply 62 and the impedance of the load side (the lower electrode 18 side). Further, the first radio-frequency power supply 62 may be connected to the upper electrode 30 via the matching device 66. The first radio-frequency power supply 62 constitutes an example of a plasma generator.

The second radio-frequency power supply 64 is a power supply that generates a second radio-frequency power. The second radio-frequency power supply 64 is configured to supply a radio-frequency to the internal space 10s. The second radio-frequency power has a frequency lower than a frequency of the first radio-frequency power. When the second radio-frequency power is used together with the first radio-frequency power, the second radio-frequency power is used as a radio-frequency power for bias that attracts ions to the substrate W. The frequency of the second radio-frequency power is within the range of, for example, 400 kHz to 13.56 MHz. The second radio-frequency power supply 64 is connected to the lower electrode 18 via the matching device 68 and the electrode plate 16. The matching device 68 includes a circuit that matches the output impedance of the second radio-frequency power supply 64 and the impedance of the load side (the lower electrode 18 side).

Further, the plasma may be generated using the second radio-frequency power without using the first radio-frequency power, that is, using only the single radio-frequency power. In this case, the frequency of the second radio-frequency power may be a frequency higher than 13.56 MHz, for example, 40 MHz. The plasma processing apparatus 1 may not include the first radio-frequency power supply 62 and the matching device 66. The second radio-frequency power supply 64 constitutes an example of a plasma generator.

In the plasma processing apparatus 1, gas is supplied from the gas supply to the internal space 10s to generate plasma. Further, when the first radio-frequency power and/or the second radio-frequency power is supplied, a radio-frequency electric field is generated between the upper electrode 30 and the lower electrode 18. The generated radio-frequency electric field generates plasma.

The plasma processing apparatus 1 may further include a controller 80. The controller 80 may be a computer including a processor, a storage such as a memory, an input device, a display device, and a signal input/output interface. The controller 80 controls each part of the plasma processing apparatus 1. The controller 80 is configured to control the first radio-frequency power supply 62 and the like (the first radio-frequency power supply 62, the second radio-frequency power supply 64) and the gas source group 40.

In the controller 80, an operator may use the input device to input a command in order to manage the plasma processing apparatus 1. Further, in the controller 80, the display device may visualize and display the operating status of the plasma processing apparatus 1. In addition, the storage stores a control program and recipe data. The control program is performed by the processor in order to perform various processes in the plasma processing apparatus 1. The processor performs the control program and controls each part of the plasma processing apparatus 1 according to the recipe data.

The controller 80 is configured to perform the method MT illustrated in the flowchart of FIG. 1 by controlling the respective configurations of the plasma processing apparatus 1 (specifically, the gas source group 40, the first radio-frequency power supply 62). The controller 80 is configured to control the first radio-frequency power supply 62 and the gas source group 40 to particularly perform the following processes A and B in a state where the substrate W is accommodated in the internal space 10s.

That is, the controller 80 supplies the first gas into the internal space 10s to form a precursor layer PC on the substrate W (process A). The controller 80 supplies the second gas into the internal space 10s after the precursor layer PC is formed and supplies energy to at least one of the precursor layer PC and the second gas, so that the organic film (organic film OFa) is formed on the substrate W (process B).

Referring back to FIG. 1, the method MT will be described. Hereinafter, as an example, descriptions will be made on a case where the method MT is performed using the plasma processing apparatus 1. The method MT includes step ST1, step STJ, and step ST2. The step ST1 includes step ST11 and step ST12. The step ST1 may include step STPa and step STPb. Further, the method MT may include at least one of step STa, step STb, step STc, and step STd.

Figure 3:
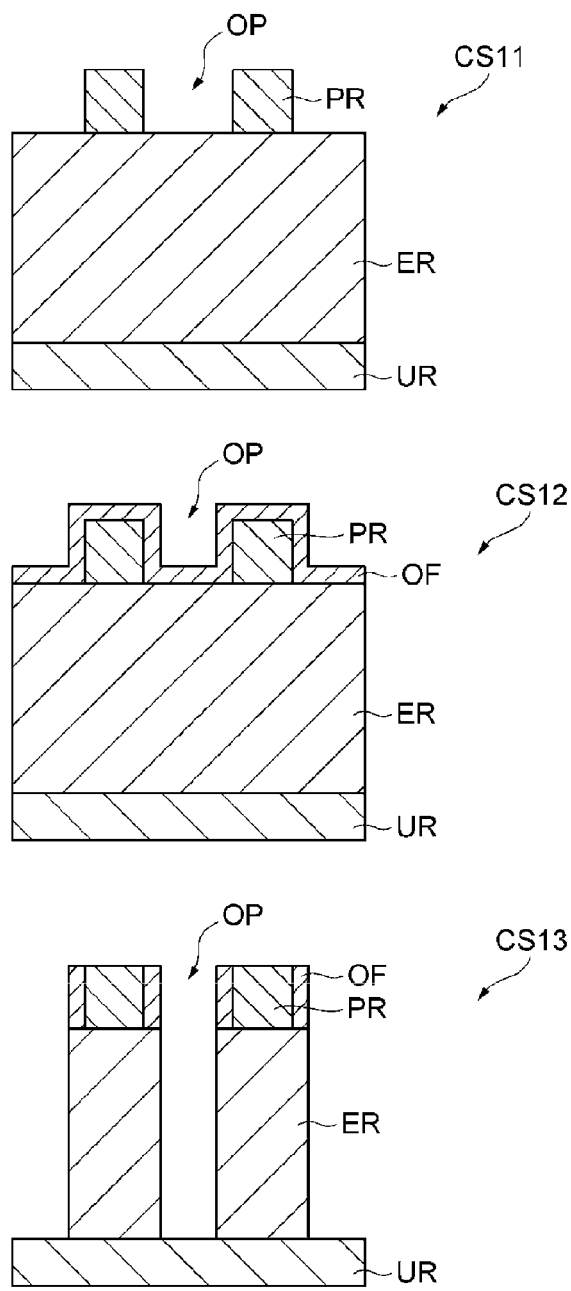
FIG. 3 illustrates a plurality of cross-sections of a substrate associated with performing the flowchart illustrated in FIG. 1.

In the following descriptions, FIG. 3 will be referred to together with FIG. 1. A cross section CS11 illustrated in FIG. 3 is an example of a cross section in which a part of the substrate W to which the method MT is applied is enlarged. A cross section CS12 illustrated in FIG. 3 is an example of a cross section in which a part of the substrate W after performing the step ST1 is enlarged. A cross section CS13 illustrated in FIG. 3 is an example of a cross section in which a part of the substrate W after performing the step ST2 is enlarged.

The substrate W having the cross section CS11 is provided in the internal space 10s before the step ST11 is performed. As illustrated in the cross section CS11, the substrate W has an underlying region UR, a region ER, and a region PR. The region ER is an etching region that is etched in the method MT and is formed in, for example, a layer. The region ER is provided on the underlying region UR. The region PR is provided on the region ER. In this way, the substrate W includes the region ER and a patterned region PR provided on the region ER.

The surface of the substrate W having the cross section CS11 is pre-patterned to provide a plurality of openings OP. The plurality of openings OP may have a constant aspect ratio or may have different aspect ratios.

The region ER includes a silicon-containing film, and the material of the region ER is, for example, a silicon-containing material. The material of the region PR may be, for example, an organic material, a silicon-containing material, or a metal-containing material (e.g., a titanium-containing material or a tungsten-containing material). When the material of the region PR is a silicon-containing material, the material of the region ER may be another silicon-containing material. For example, when the material of the region PR is silicon nitride, the material of the region ER may be silicon oxide.

The step ST1 is performed in a state in which the substrate W having the cross section CS11 is provided in the internal space 10s and then, the substrate W is placed in the internal space 10s. In the step ST1, the organic film OF (organic film OFa) is formed on the substrate W. The substrate W is placed on the electrostatic chuck 20 in the internal space 10s.

The organic film OF is formed in the opening OP by the step ST1. More specifically, in the step ST1, the organic film OF is formed on the surface of the substrate W, as illustrated in the cross section CS12. Thus, in the step ST1, the organic film OF is formed on the side surface of the patterned region PR.

In the step ST11, the precursor layer PC is formed on the substrate W by supplying the first gas GS containing an organic compound to the internal space 10s. In the step ST11, the first gas GS is supplied toward the substrate W. In the step ST11, the first gas GS is supplied from the gas source group 40 to the internal space 10s. The first gas contains an organic compound.

When the step ST11 is performed, the organic compound of the first gas GS is adsorbed to the substrate W or the already formed organic film. As a result, the precursor layer PC containing the organic compound of the first gas GS is formed on the substrate W.

The step STPa is performed between the step ST11 and the step ST12. In the step STPa, purging of the internal space 10s is performed. That is, the gas in the internal space 10s is discharged.

In the step STPa, an inert gas such as a rare gas or a nitrogen gas may be supplied from the gas source group 40 to a processing space. When the step STPa is performed, the organic compound of the first gas GS that has been excessively deposited on the substrate W is removed.

In the step ST12, the second gas is supplied into the internal space 10s, and energy is supplied to at least one of the precursor layer PC and the second gas to modify the precursor layer PC, so that the organic material (organic film OFa) is formed on the substrate W. The second gas contains a modifying gas. The energy supplied to at least one of the precursor layer PC and the second gas in this manner may be radio-frequency, microwave, or heat.

Figure 7:
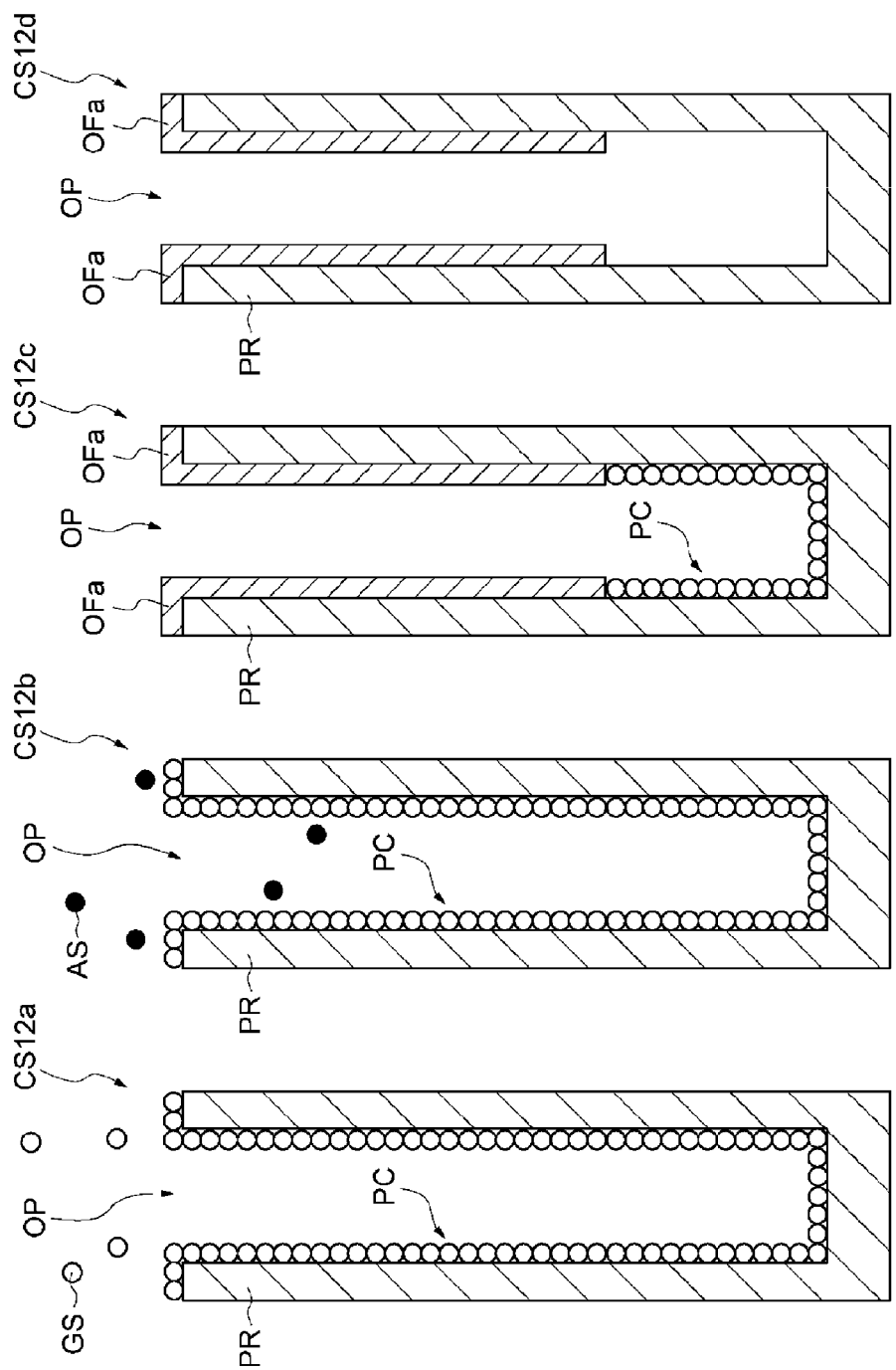
FIG. 7 is a diagram for explaining the formation of an organic film in performing the flowchart illustrated in FIG. 1 in more detail.

For example, in the step ST12, the plasma of the second gas is generated in the internal space 10s to react the precursor layer PC with the plasma of the second gas (active species AS illustrated in FIG. 7), whereby an organic film on the substrate W is formed.

In the step ST12, the plasma of a second gas is generated. In the step ST12 of the embodiment, the second gas is supplied from the gas source group 40 to the internal space 10s. The second gas may be suitably selected according to the organic compound of the first gas GS.

In the step ST12, the second gas is excited in the internal space 10s to generate the plasma of the second gas. In the step ST12, active species AS such as ions and radicals contained in the plasma of the second gas react with the precursor layer PC that contains the organic compound of the first gas GS formed on the substrate W.

The step STPb is performed during performing the step ST12. In the step STPb, purging of the internal space 10s is performed. That is, the gas in the internal space 10s is discharged. In the step STPb, an inert gas such as a rare gas or a nitrogen gas ($N_2$ gas) may be supplied from the gas source group 40 to the internal space 10s.

When the step STPb is performed, the precursor layer PC on the substrate W that has not reacted with the active species AS is removed.

In the step ST1, the step ST11 and the step ST12 may be alternately repeated through the step STJ. For example, a sequence including the step ST11 and the step ST12 is performed a preset number of times. The film thickness of the organic film OF is determined by the specified number of times.

In the step STJ, it is determined that the stop condition has been satisfied. For example, when the number of times the sequence is performed reaches the specified number, the stop condition is determined to have been satisfied.

In the step STJ, when it is determined that the stop condition has not been satisfied, the sequence is performed again. Meanwhile, in the step STJ, when it is determined that the stop condition has been satisfied, the step ST1 is ended.

The specified number of times of the sequence in the step ST1 may be one. Further, each sequence of the step ST1 may not include at least one of the step STPa and the step STPb.

When the step ST1 is performed, the organic film OF is formed on the surface of the substrate W, as illustrated in the cross section CS12. The width of the opening OP in the region PR is adjusted according to the thickness of the organic film OF.

In the method MT, the step ST1 is subsequently performed. The step ST2 is performed in a state where the substrate W is placed in the internal space 10s. In the step ST2, the plasma processing of the region ER is performed. In the step ST2, the region ER is etched using the plasma of the processing gas after the organic film OF is formed according to the steps ST1 and STJ.

In the step ST2, the processing gas is supplied into the internal space 10s. When the material of the region ER is silicon oxide, the processing gas contains a fluorocarbon gas (e.g., $C_4F_6$ gas) and may further contain a rare gas and an oxygen gas ($O_2$ gas).

The processing gas may include at least one of a hydrofluorocarbon gas, an NF-based gas, or an HF-based gas in addition to the fluorocarbon gas or in place of the fluorocarbon gas.

In the step ST2, the exhaust device 50 is controlled so that the pressure in the internal space 10s is set to the designated pressure. In the step ST2, the first radio-frequency is supplied to excite the processing gas. In the step ST2, the second radio-frequency may be supplied together with the first radio-frequency.

In the step ST2, the processing gas is excited in the internal space 10s to generate plasma of the processing gas. In the step ST2, the region ER is etched by active species such as ions and radicals contained in the plasma of the processing gas. As a result, as illustrated in the cross section CS13, the region ER is removed in the portion exposed from the region including the region PR and the organic film OF.

The method MT may further include step STb (breakthrough step) of removing the organic film OF formed on the region ER before the step ST2. The step STb is performed between the step ST1 and the step ST2. In the step STb, the organic film OF extending over the portion to be etched in the region ER is removed.

In the step STb, a processing gas containing, for example, a nitrogen gas ($N_2$ gas) and a hydrogen gas ($H_2$ gas) is supplied to the internal space 10s.

In the step STb, the exhaust device 50 is controlled so that the pressure in the internal space 10s is set to the designated pressure. In the step STb, the first radio-frequency is supplied to excite the processing gas. In the step STb, the second radio-frequency may be supplied together with the first radio-frequency.

When the step STb is performed, the organic film OF extending over the portion to be etched in the region ER is removed and the region ER is exposed.

In the steps ST1 and ST2 of the method MT described above, an organic film is formed on the surface of the substrate W by a reaction between the organic compound of the first gas GS and the modifying gas of the second gas. When the sequence of the step ST1 including the steps ST11, STPa, ST12, and STPb is performed a plurality of times, a conformal organic film OF having a suitable film thickness is formed as in the film formation by an atomic layer deposition method.

Figure 4:
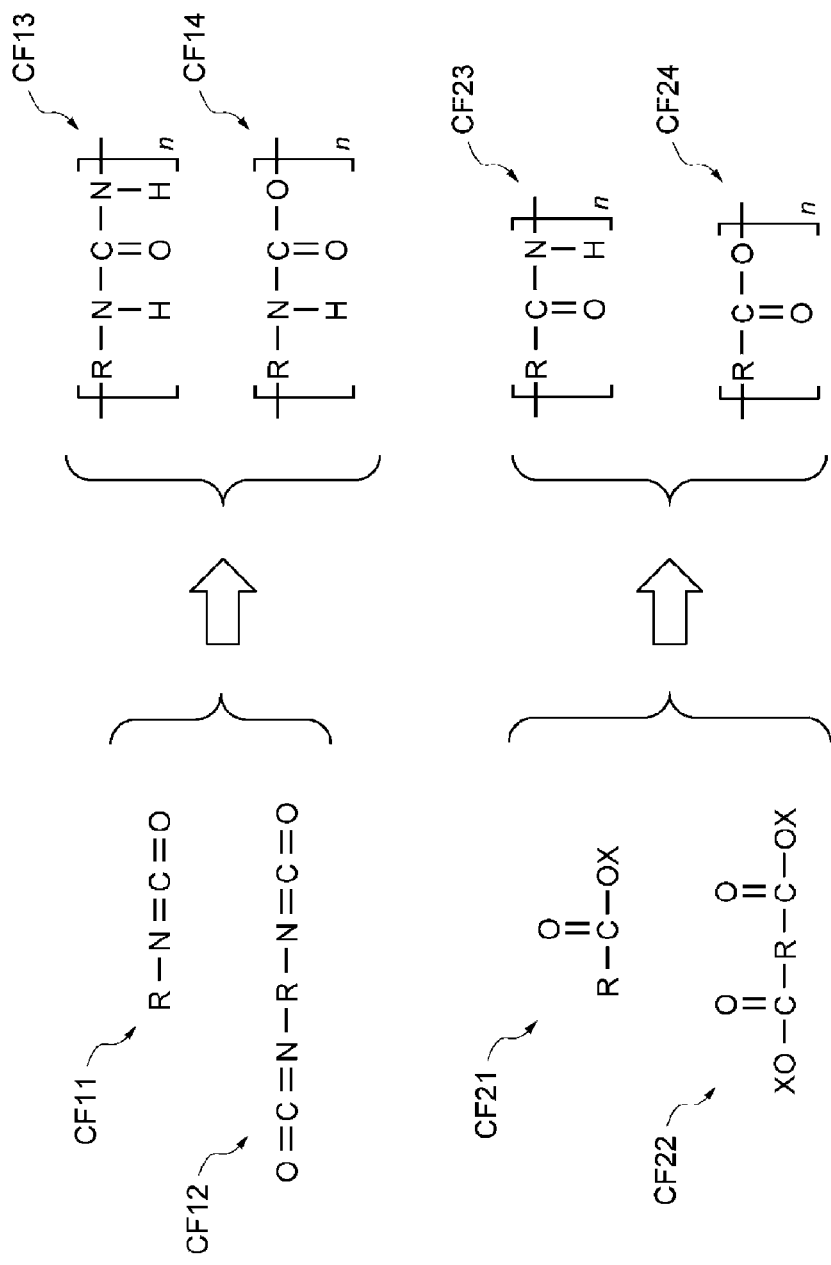
FIG. 4 is a diagram illustrating a plurality of chemical formulas that illustrate various gases and products associated with performing the flowchart illustrated in FIG. 1.
Figure 5:
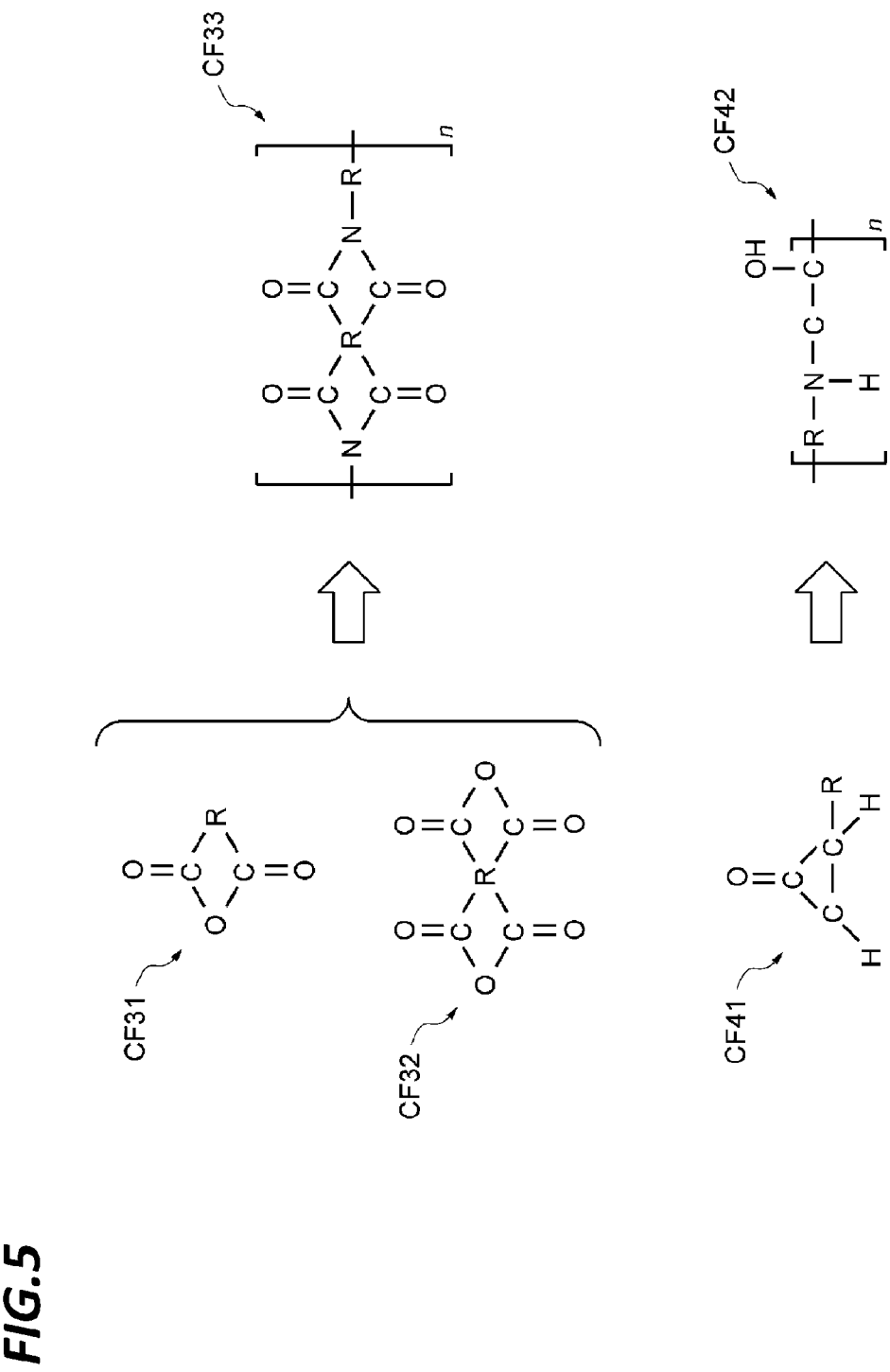
FIG. 5 is a diagram illustrating a plurality of chemical formulas that illustrate various gases and products associated with performing the flowchart illustrated in FIG. 1.

With reference to FIGS. 4 and 5, descriptions will be made on an example of the organic compound that constitutes the organic film OF generated by the reaction between the organic compound of the first gas GS and the modifying gas of the second gas.

The first gas GS contains at least one organic compound selected from the group consisting of epoxides, carboxylic acids, carboxylic acid halides, carboxylic acid anhydrides, isocyanates, and phenols.

The second gas contains at least one modifying gas selected from the group consisting of an inorganic compound gas having an NH bond, an inert gas, a mixed gas of $N_2$ and $H_2$, a $H_2O$ gas, and a mixed gas of $H_2$ and $O_2$. For example, at least one selected from the group consisting of $N_2H_2$, $N_2H_4$, and $NH_3$ may be used as the inorganic compound gas having an NH bond. As the inert gas, a rare gas such as Ar or $N_2$ gas may be used.

When the first gas contains at least one selected from the group consisting of carboxylic acids, carboxylic halides, and isocyanates, the second gas contains at least one selected from the group consisting of the following gases. Such a group of gases includes an inorganic compound gas having an NH bond, an inert gas, a mixed gas of $N_2$ and $H_2$, a $H_2O$ gas, and a mixed gas of $H_2$ and $O_2$.

When the first gas GS is at least one selected from the group consisting of epoxides, carboxylic anhydrides, and phenols, the second gas contains at least one selected from the group consisting of an inorganic compound gas having an NH bond, an inert gas, and a mixed gas of $N_2$ and $H_2$.

The organic compound of the first gas GS may be, for example, a carboxylic acid or a carboxylic acid halide having a chemical formula CF21 or a chemical formula CF22 illustrated in FIG. 4. The organic compound of the first gas GS may be a monofunctional carboxylic acid or a difunctional carboxylic acid.

When the organic compound is, for example, a carboxylic acid or a carboxylic acid halide of the chemical formula CF21 or the chemical formula CF22, any of the following gases may be used as the modifying gas of the second gas. Examples of such gases include an inorganic compound gas having an NH bond, an inert gas, a mixed gas of $N_2$ and $H_2$, a $H_2O$ gas, and a mixed gas of $H_2$ and $O_2$.

In the chemical formula CF21 and the chemical formula CF22, R refers to a group that contains a saturated hydrocarbon group such as an alkyl group (a linear alkyl group or a cyclic alkyl group), an unsaturated hydrocarbon group such as an aryl group, or a hetero atom such as N, O, S, F, or Si. The group containing a hetero atom includes a saturated hydrocarbon group or an unsaturated hydrocarbon group in which certain elements are substituted with N, O, S, F, or Si. In the chemical formulas CF21 and CF22, X may be H or a halogen atom. Examples of the carboxylic acid that is an organic compound of the first gas GS include terephthalic acid.

For example, an organic compound that may be generated by a reaction of a carboxylic acid or a carboxylic acid halide of the chemical formula CF21 or the chemical formula CF22 with plasma of any gas of an inorganic compound gas having an NH bond, an inert gas, and a mixed gas of $N_2$ and $H_2$ may be a polymeric compound having an amide bond. Such a polymeric compound having an amide bond may be, for example, a compound of the chemical formula CF23 (e.g., polyamide) illustrated in FIG. 4. In the chemical formula CF23, n is an integer of 2 or more.

For example, an organic compound that may be generated by the reaction of a carboxylic acid or a carboxylic acid halide of the chemical formula CF21 or the chemical formula CF22 with plasma of any gas of $H_2O$ gas and a mixed gas of $H_2$ and $O_2$ may be a polymeric compound having an ester bond. Such a polymeric compound having an ester bond may be, for example, a compound of the chemical formula CF24 (e.g., polyester) illustrated in FIG. 4. In the chemical formula CF24, n is an integer of 2 or more.

Further, the organic compound of the first gas GS may be, for example, an isocyanate having the chemical formula CF11 or the chemical formula CF12 illustrated in FIG. 4. The organic compound of the first gas GS may be a monofunctional isocyanate or a difunctional isocyanate.

The modifying gas of the second gas that may be used when the organic compound is an isocyanate of the chemical formula CF11 or the chemical formula CF12 may be any of an inorganic compound gas having an NH bond, an inert gas, a mixed gas of $N_2$ and $H_2$, a $H_2O$ gas, and a mixed gas of $H_2$ and $O_2$.

In the chemical formula CF11 and the chemical formula CF22, R refers to a group that contains a saturated hydrocarbon group such as an alkyl group (a linear alkyl group or a cyclic alkyl group), an unsaturated hydrocarbon group such as an aryl group, or a hetero atom such as N, O, S, F, or Si. The group containing a hetero atom includes a saturated hydrocarbon group or an unsaturated hydrocarbon group in which certain elements are substituted with N, O, S, F, or Si. As the isocyanate which is the organic compound of the first gas GS, for example, an aliphatic compound or an aromatic compound may be used. As the aliphatic compound, an aliphatic chain compound or an aliphatic cyclic compound may be used. Examples of the aliphatic compound include hexamethylene diisocyanate. Further, examples of the aliphatic cyclic compound include 1,3-bis (isocyanatomethyl)cyclohexane (H6XDI).

For example, an organic compound that may be generated by a reaction of isocyanate of the chemical formula CF11 or the chemical formula CF12 with plasma of any gas of an inorganic compound gas having an NH bond, an inert gas, and a mixed gas of $N_2$ and $H_2$ may be a polymeric compound having a urea bond. Such a polymeric compound having an ester bond is, for example, a compound represented by the chemical formula CF13 illustrated in FIG. 3 and may be generated by a reaction which is similar to plasma polymerization. In the chemical formula CF13, n is an integer of 2 or more.

For example, an organic compound that may be generated by the reaction of isocyanate of the chemical formula CF11 or the chemical formula CF12 with plasma of any gas of $H_2O$ gas and a mixed gas of $H_2$ and $O_2$ may be a polymeric compound having a urethane bond. Such a polymeric compound having a urethane bond is, for example, a compound having the chemical formula CF14 illustrated in FIG. 4 (e.g., polyurethane) and may be generated by a reaction which is similar to plasma polymerization. In the chemical formula CF14, n is an integer of 2 or more.

Further, the organic compound of the first gas GS may be, for example, a carboxylic acid anhydride of the chemical formula CF31 or the chemical formula CF32 illustrated in FIG. 5.

The modifying gas of the second gas that may be used when the organic compound is a carboxylic acid anhydride of the chemical formula CF31 or the chemical formula CF32 may be any of an inorganic compound gas having an NH bond, an inert gas, and a mixed gas of $N_2$ and $H_2$.

In the chemical formula CF31 and the chemical formula CF22, R refers to a group that contains a saturated hydrocarbon group such as an alkyl group (a linear alkyl group or a cyclic alkyl group), an unsaturated hydrocarbon group such as an aryl group, or a hetero atom such as N, O, S, F, or Si. The group containing a hetero atom includes a saturated hydrocarbon group or an unsaturated hydrocarbon group in which certain elements are substituted with N, O, S, F, or Si. Examples of the carboxylic acid anhydride that is an organic compound of the first gas GS include a pyromellitic acid anhydride.

For example, an organic compound that may be generated by a reaction of a carboxylic acid anhydride of the chemical formula CF31 or the chemical formula CF32 with plasma of any gas of an inorganic compound gas having an NH bond, an inert gas, and a mixed gas of $N_2$ and $H_2$ may be a polymeric compound having an imide bond. Such a polymeric compound having an imide bond may be, for example, a compound of the chemical formula CF33 illustrated in FIG. 5. In the chemical formula CF33, n is an integer of 2 or more.

Further, the organic compound of the first gas GS may be, for example, an epoxide having the chemical formula CF41 illustrated in FIG. 5. The modifying gas of the second gas that may be used when the organic compound is, for example, an epoxide of the chemical formula CF41 may be any of an inorganic compound gas having an NH bond, an inert gas, and a mixed gas of $N_2$ and $H_2$.

In the chemical formula CF41, R refers to a group that contains a saturated hydrocarbon group such as an alkyl group (a linear alkyl group or a cyclic alkyl group), an unsaturated hydrocarbon group such as an aryl group, or a hetero atom such as N, O, S, F, or Si. The group containing a hetero atom includes a saturated hydrocarbon group or an unsaturated hydrocarbon group in which certain elements are substituted with N, O, S, F, or Si.

For example, an organic compound that may be generated by a reaction of an epoxide of the chemical formula CF41 with plasma of any gas of an inorganic compound gas having an NH bond, an inert gas, and a mixed gas of $N_2$ and $H_2$ may be an epoxy. Such an epoxy may be, for example, a polymeric compound of the chemical formula CF42 illustrated in FIG. 5. In the chemical formula CF42, n is an integer of 2 or more.

In addition to the above, phenols may be used as the organic compound of the first gas GS. As the phenols, for example, phenol, cresol, and benzenediol may be used. In this case, at least one selected from the group consisting of an inorganic compound gas having an NH bond, an inert gas, and a mixed gas of $N_2$ and $H_2$ may be used as the modifying gas of the second gas.

Figure 6:
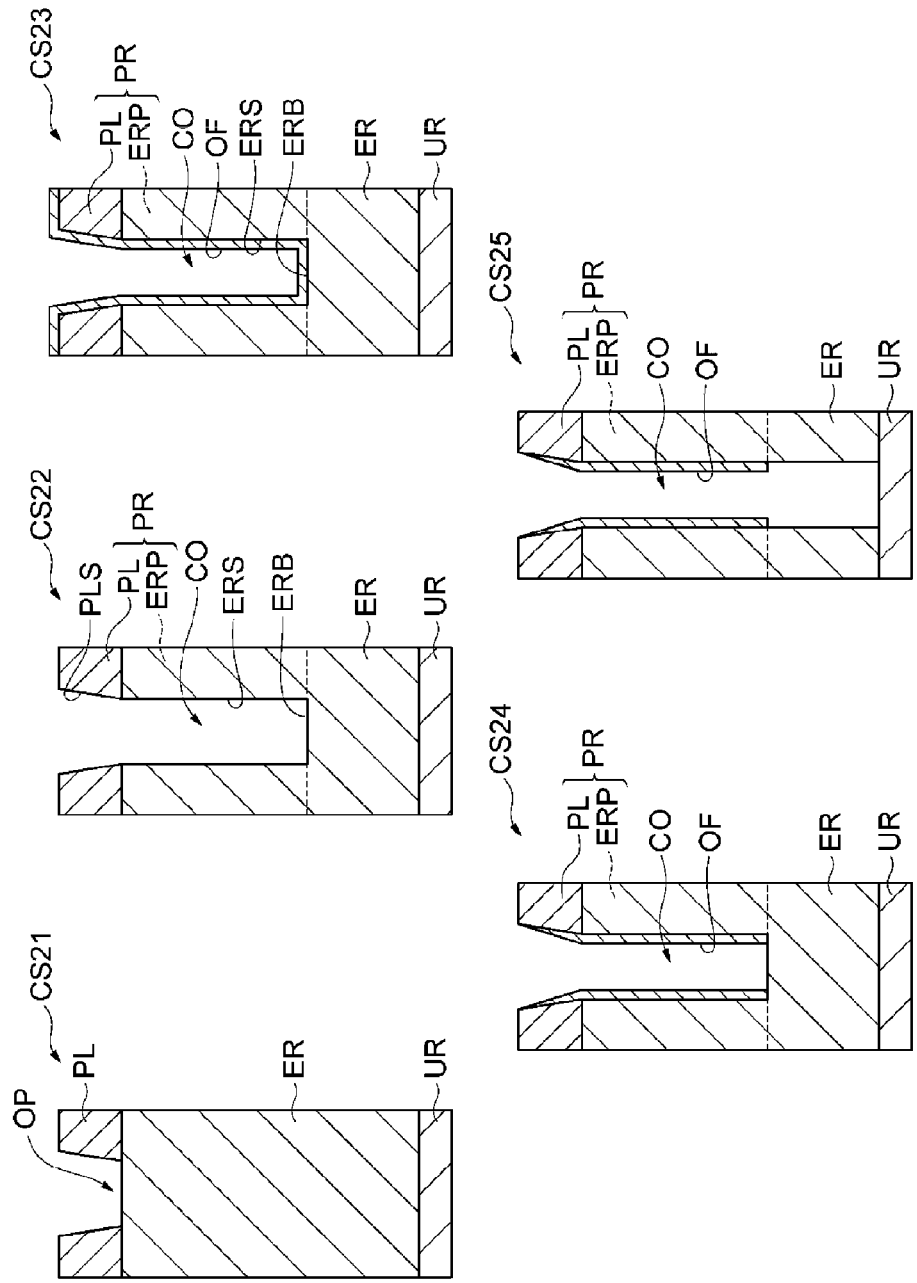
FIG. 6 illustrates a plurality of cross-sections of a substrate associated with performing the flowchart illustrated in FIG. 1.

In the following descriptions, FIG. 6 will be referred to together with FIG. 1. A cross section CS21 illustrated in FIG. 6 is an example of a cross section in which a part of the substrate W to which the method MT is applicable is enlarged. A cross section CS22 illustrated in FIG. 6 is an example of a cross section in which a part of the substrate W after performing the step STa is enlarged.

A cross section CS23 illustrated in FIG. 6 is an example of a cross section in which a part of the substrate W after performing the step ST1 is enlarged. A cross section CS24 illustrated in FIG. 6 is an example of a cross section in which a part of the substrate W after performing the step STb is enlarged. A cross section CS25 illustrated in FIG. 6 is an example of a cross section in which a part of the substrate W after performing the step ST2 is enlarged.

In the embodiment, the method MT may be applied to the substrate W having the cross section CS21. In this case, the method MT is performed using the plasma processing apparatus 1. The method MT is performed in a state where the substrate W is placed in the internal space 10s.

The substrate W having the cross section CS21 has an underlying region UR, a region ER, and a patterned layer PL. The region ER is provided on the underlying region UR. The region ER is, for example, a silicon film. The layer PL is provided on the region ER. The material of the layer PL may be, for example, silicon oxide.

The surface of the substrate W having the cross section CS21 is pre-patterned to provide a plurality of openings OP. More specifically, the layer PL illustrated in the cross section CS21 is patterned in advance. The layer PL is patterned to provide the openings OP. The plurality of openings OP may have a constant aspect ratio or may have different aspect ratios.

The method MT applied to the substrate W having the cross section CS21 further includes the step STa. The step STa and the subsequent steps are performed after the step of providing the substrate W in the internal space 10s of the chamber 10. The step STa is performed after the substrate W having the cross section CS21 is provided in the internal space 10s and before the step ST1.

In the step STa, the plasma etching of the region ER is performed. In the step STa, the region ER is partially etched to form a recess CO. Specifically, the region ER is etched to a position between the surface (the surface on the layer PL side) and the bottom surface (the surface on the underlying region UR side) in the film thickness direction of the region ER.

In the method MT applied to the substrate W having the cross section CS21, the processing gas is supplied to the internal space 10s in the step STa.

The processing gas is a halogen-containing gas and includes, for example, HBr gas. The processing gas may contain $Cl_2$ gas in addition to HBr gas or instead of HBr gas.

In the step STa, the exhaust device 50 is controlled so that the pressure in the internal space 10s is set to the designated pressure. In the step STa, the first radio-frequency is supplied to excite the processing gas. In the step STa, the second radio-frequency may be supplied together with the first radio-frequency.

In the step STa, the region ER is etched by active species such as ions and radicals contained in the plasma of the processing gas to form the recess CO (see the cross section CS22). As described above, the method MT has the step STa of forming the recess CO by supplying the processing gas into the internal space 10s and partially etching the region ER of the substrate W through the patterned region (layer PL) of the substrate W before the step ST1. The surface of the region ER that defines the recess CO includes a bottom surface ERB and a side surface ERS.

In the method MT applied to the substrate W having the cross section CS21, the step ST1 is subsequently performed. The organic film OF is formed in the recess CO by the step ST1. More specifically, when the step ST1 is performed, the organic film OF is formed on the surface of the layer PL and the surface of the recess CO, as illustrated in the cross section CS23.

In the method MT applied to the substrate W having the cross section CS21, the step STb may be performed after the step ST1. When the step STb is performed, the organic film OF extending on the bottom surface ERB is removed (see the cross section CS24). The plasma of the processing gas used in the step STb removes the organic film OF extending on the bottom surface ERB.

In the method MT applied to the substrate W having the cross section CS21, the step ST2 is subsequently performed. In the step ST2, plasma of the processing gas is generated as in the step STa. As a result, the recess CO is further etched as illustrated in the cross section CS25.

During performing the step ST2, the lateral etching of a portion ERP of the region ER is suppressed by the organic film OF extending on the side surface ERS. That is, the lateral etching of the recess CO is suppressed.

The method MT applied to the substrate W having the cross section CS21 further includes the step STc. In the step STc, the organic film OF may be removed. The organic film OF may be removed by the plasma of the processing gas generated in the internal space 10s. This processing gas contains, for example, $N_2$ gas and $H_2$ gas.

The organic film OF may also be removed by heating the substrate W. Such an organic film OF may include an organic compound (e.g., organic compound of the chemical formula CF13 or the chemical formula CF14 illustrated in FIG. 3) that is generated when the organic compound of the first gas GS is an isocyanate (e.g., organic compound of the chemical formula CF11 or the chemical formula CF12 illustrated in FIG. 3). The temperature of the substrate W for removing the organic film OF may be 250° C. or higher and 400° C. or lower. When the substrate W is heated in this way, depolymerization of the organic compound that forms the organic film OF occurs. The organic compound gas generated by depolymerization is exhausted. Further, the substrate W may be heated by one or more heaters in the electrostatic chuck 20.

In the step ST1, the sub-conformal organic film OF may be formed on at least a part of the surface of the layer PL and the side surface of the recess CO. Here, the sub-conformal organic film means an organic film OF having different thicknesses along the thickness direction of the substrate. In this case, since the organic film OF is not formed on the bottom surface of the recess CO, it is not necessary to perform the step STb.

The sub-conformal organic film OF may be formed by not forming the precursor layer PC on the entire surface of the recess CO in the step ST11 and/or not modifying the precursor layer PC on the entire surface of the recess CO in the step ST12. Hereinafter, detailed descriptions will be made on a case where the precursor layer PC is not modified on the entire surface of the recess CO with reference to FIG. 7.

A cross section CS12a illustrated in FIG. 7 is an example of a cross section in which a part of the substrate W after performing the step ST11 is enlarged. A cross section CS12b illustrated in FIG. 7 is an example of a cross section in which a part of the substrate W during performing the step ST12 is enlarged. A cross section CS12c illustrated in FIG. 7 is an example of a cross section in which a part of the substrate W after performing the step ST12 is enlarged. A cross section CS12d illustrated in FIG. 7 is an example of a cross section in which a part of the substrate W after performing the step STPb is enlarged.

In the example illustrated in FIG. 7, the formation range of the organic film OF in the opening OP may be adjusted by adjusting the time of performing the step ST12, that is, the supply time of the active species AS contained in the plasma of the second gas. By adjusting the time of performing the step ST12, the range of the precursor layer PC that reacts with the active species AS contained in the plasma may be adjusted appropriately.

When the time of performing the step ST12 is sufficiently long, the active species AS may react with the entire precursor layer PC already formed in the opening OP by the step ST11. In this case, the entire side surface inside the opening OP is covered with the organic film OFa. The time of performing the step ST12 may be adjusted so that the active species AS 2 reacts only with a part of the precursor layer PC already formed in the opening OP by the step ST11. The formation range of the organic film OF in the opening OP is appropriately adjusted by repeatedly performing the step ST1 including the step ST12 of the execution time.

Figure 8:
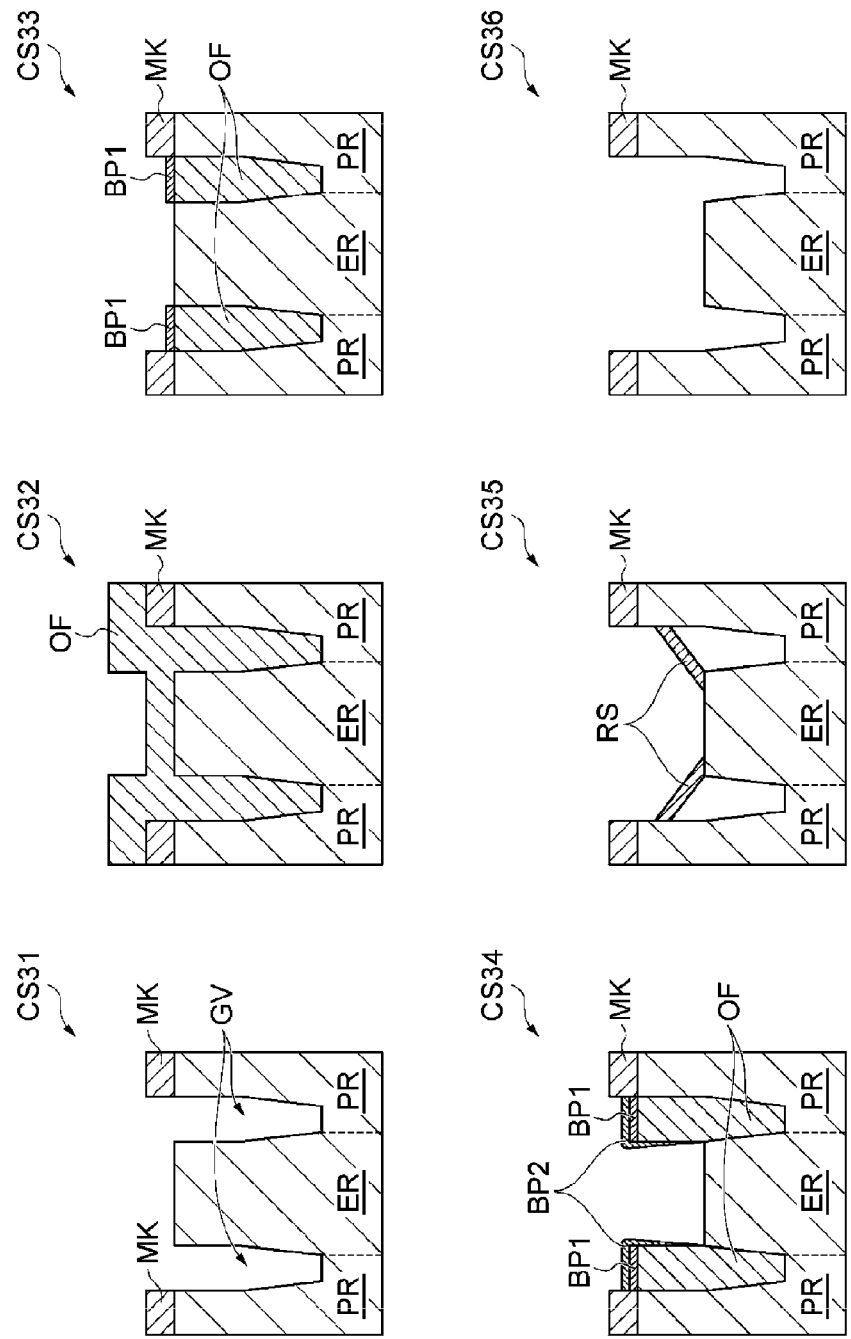
FIG. 8 illustrates a plurality of cross-sections of the substrate associated with performing the flowchart illustrated in FIG. 1.

In the following descriptions, FIG. 8 will be referred to together with FIG. 1. A cross section CS31 illustrated in FIG. 8 is an example of a cross section in which a part of the substrate W to which the method MTA is applicable is enlarged. A cross section CS32 illustrated in FIG. 8 is an example of a cross section in which a part of the substrate W after performing the step ST1 is enlarged. A cross section CS33 illustrated in FIG. 8 is an example of a cross section in which a part of the substrate W after performing the step STb is enlarged.

A cross section CS34 illustrated in FIG. 8 is an example of a cross section in which a part of the substrate W after performing the step ST21 is enlarged. A cross section CS35 illustrated in FIG. 8 is an example of a cross section in which a part of the substrate W after performing the step ST1 is enlarged. A cross section CS36 illustrated in FIG. 8 is an example of a cross section in which a part of the substrate W after performing the step STd is enlarged.

In the embodiment, the method MT may be applied to the substrate W illustrated in the cross section CS31. In this case, the method MT is performed using the plasma processing apparatus 1. The method MT is performed in a state where the substrate W is placed in the internal space 10s.

As illustrated in the cross section CS31, the substrate W has a region PR, a region ER, and a mask MK. The region ER is surrounded by the side faces of the region PR or is sandwiched between a pair of side faces of the region PR. The region ER is a region that is etched by performing the method MT.

The mask MK is provided on the top of the region PR. The material of the mask MK is a material resistant to etching of the region ER, for example, an organic material or a metal-containing material. Examples of the metal-containing material include a titanium-containing material and a tungsten-containing material.

A groove GV may be interposed between the region ER and the region PR. The surface of the substrate W having the cross section CS31 is pre-patterned to provide a plurality of openings OP. More specifically, the layer PL illustrated in the cross section CS31 is patterned in advance. The region PR is patterned to provide the grooves GV. The plurality of grooves GV may have a constant aspect ratio or may have different aspect ratios.

The materials of the regions ER and PR may be the same as each other. In this case, the regions ER and PR are formed by etching a single film. The material of the regions PR and ER may be, for example, a low dielectric constant material or a porous layer. Low dielectric constant materials include, for example, silicon, oxygen, carbon, and hydrogen. More specifically, the material of the region PR and the region ER may be, for example, a silicon-containing material.

In the method MT applied to the substrate W having the cross section CS31, the step ST1 may be performed on the substrate W having the cross section CS31 after the substrate W having the cross section CS31 is provided in the internal space 10s. The sequence including the step ST11 and the step ST12 is performed one or more times through the step STJ.

By performing the step ST1, as illustrated in the cross section CS32, the organic film OF is formed on the surface of the mask MK, the surface of the region PR, and the surface of the region ER. The organic film OF covers the surface of the substrate W, that is, the surface of the mask MK, the surface of the region PR, and the surface of the region ER. In particular, the organic film OF is formed within the groove GV. More specifically, the groove GV is filled with the organic film OF.

In the method MT applied to the substrate W having the cross section CS31, the step ST2 is subsequently performed. By performing the step STb, as illustrated in the cross section CS33, the organic film OF extending over the upper surface of the region ER is etched along the side surfaces (or the pair of side surfaces) of the region PR, that is, so that the organic film OF remains in the groove GV.

By performing the step STb, a by-product BP1 is deposited on the organic film OF as illustrated in the cross section CS33. The by-product BP1 contains carbon. The by-product BP1 may further include nitrogen.

In the method MT applied to the substrate W having the cross section CS31, the step ST2 is subsequently performed. In the step ST2, as illustrated in the cross section CS34, plasma etching of the region ER is performed. In the step ST2, the processing gas is supplied to the internal space 10s.

The processing gas contains a fluorocarbon gas (e.g., $C_4F_8$ gas). The processing gas may further contain a rare gas, a nitrogen gas ($N_2$ gas), and an oxygen gas ($O_2$ gas). The processing gas may include at least one of a hydrofluorocarbon gas, an NF-based gas, or an HF-based gas in addition to the fluorocarbon gas or in place of the fluorocarbon gas.

In the step ST2, the exhaust device 50 is controlled so that the pressure in the internal space 10s is set to the designated pressure. In the step ST2, the first radio-frequency is supplied to excite the processing gas. In the step ST2, the second radio-frequency may be supplied together with the first radio-frequency.

In the step ST2, the region ER is etched by active species such as ions and radicals contained in the plasma of the processing gas. In this case, the plasma etching in the step ST2 may be the same as the plasma etching used for forming the groove GV.

Further, the processing gas used in the step ST2 is selected according to the material forming the region ER.

By performing the step ST2, the by-product BP2 is deposited on the by-product BP1 and the organic film OF as illustrated in the cross section CS34. The by-product BP2 includes the chemical species in the plasma generated in the step ST2 and the constituent material (e.g., silicon) of the region ER.

In the method MT applied to the substrate W having the cross section CS31, the step STc is subsequently performed. In the step STc, the organic film OF is removed, as illustrated in the cross section CS35.

The organic film OF is removed by heating the substrate W. The organic film OF may be removed as a result of depolymerization by heating. Such an organic film OF may include an organic compound (e.g., organic compound of the chemical formula CF13 or the chemical formula CF14 illustrated in FIG. 4) that is generated when the organic compound of the first gas GS is an isocyanate (e.g., organic compound of the chemical formula CF11 or the chemical formula CF12 illustrated in FIG. 4). The temperature of the substrate W for removing the organic film OF may be 250° C. or higher and 400° C. or lower. When the substrate W is heated in this way, depolymerization of the organic compound that forms the organic film OF occurs. The organic compound gas generated by depolymerization is exhausted. Further, the substrate W may be heated by one or more heaters in the electrostatic chuck 20.

In the method MT applied to the substrate W having the cross section CS31, a residue RS is formed after performing the step STc, as illustrated in the cross section CS35. The residue RS contains the by-product BP1 and/or the by-product BP2.

The step STd is performed to remove the residue RS. In the step STd, plasma etching is performed as in the step ST2. As a result of the plasma etching in the step STd, the residue RS is removed as illustrated in the cross section CS36.

Figure 9:
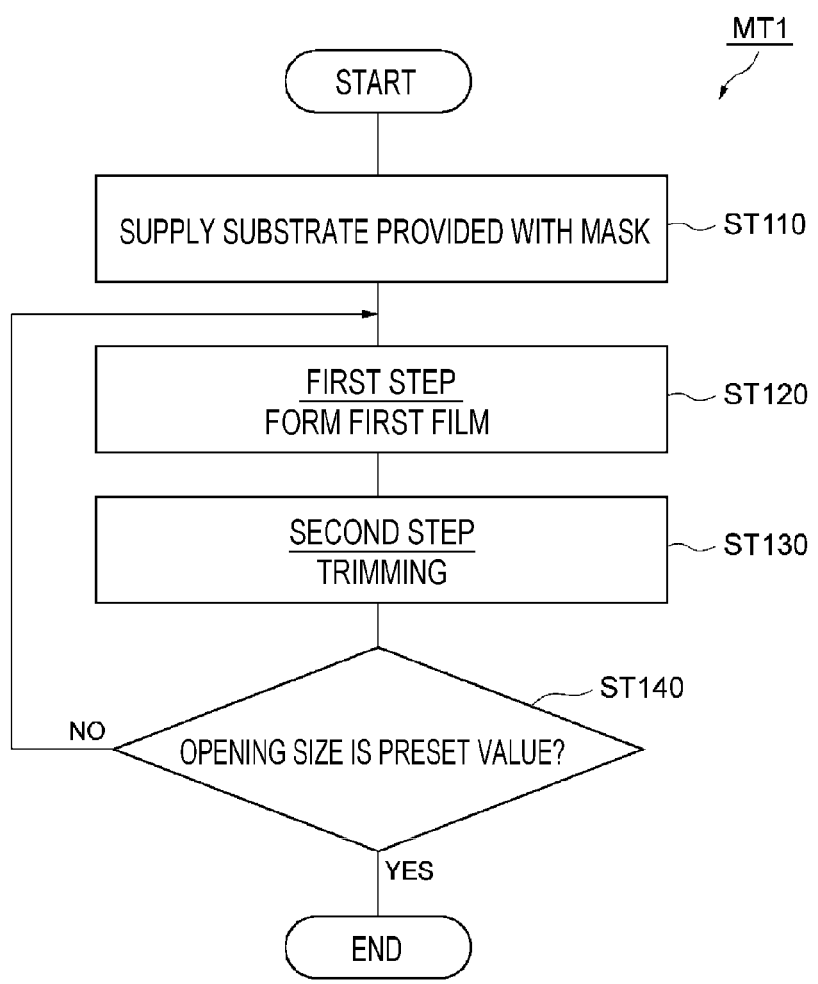
FIG. 9 is a flowchart according to another embodiment of a substrate processing method.

The flowchart illustrated in FIG. 9 represents another embodiment of a substrate processing method (hereinafter, referred to as a method MT1). The method MT1 includes, step ST110, step ST120 (first step), step ST130 (second step), and step ST140. The method MT1 may be performed using, for example, the plasma processing apparatus 1 illustrated in FIG. 2. In this case, the method MT1 may be performed by the controller 80 of the plasma processing apparatus 1.

First, in the step ST110, a substrate provided with a mask having an opening with a high aspect ratio is provided in the internal space of the chamber. Further, in the present disclosure, the phrase "opening with a high aspect ratio" refers to an opening in which the ratio of the depth to the opening size of the mask is 5 or more.

In the step ST120 subsequent to the step ST110, a first film is formed on the side surface of the mask. The first film may be, for example, an organic film. The organic film has different thicknesses along the thickness direction of the substrate. In the step ST120, the same process as the sequence including the step ST1 and the step STJ illustrated in FIG. 1 may be performed. However, the organic film in the method MT1 may be formed by not forming the precursor layer PC on the entire surface of the recess CO in the step ST11 and/or not modifying the precursor layer PC on the entire surface of the recess CO in the step ST12.

In the step ST130 subsequent to the step ST120, the first film is trimmed. In the present disclosure, trimming may be implemented by, for example, an etching process which is the same as the step ST2 illustrated in FIG. 1.

In the step ST140 subsequent to the step ST130, it is determined whether the opening size after trimming has a preset value. In the present disclosure, the opening size may be, for example, a critical dimension (CD).

When it is determined in the step ST140 that the opening size after trimming has a preset value (step ST140: "YES"), the process ends. When it is determined in the step ST140 that the opening size after trimming does not have a preset value (step ST140: "NO"), the processes of the steps ST120 to ST140 are repeated. In this way, a cycle including the step ST120 and the step ST130 is performed one or more times.

Figure 10:
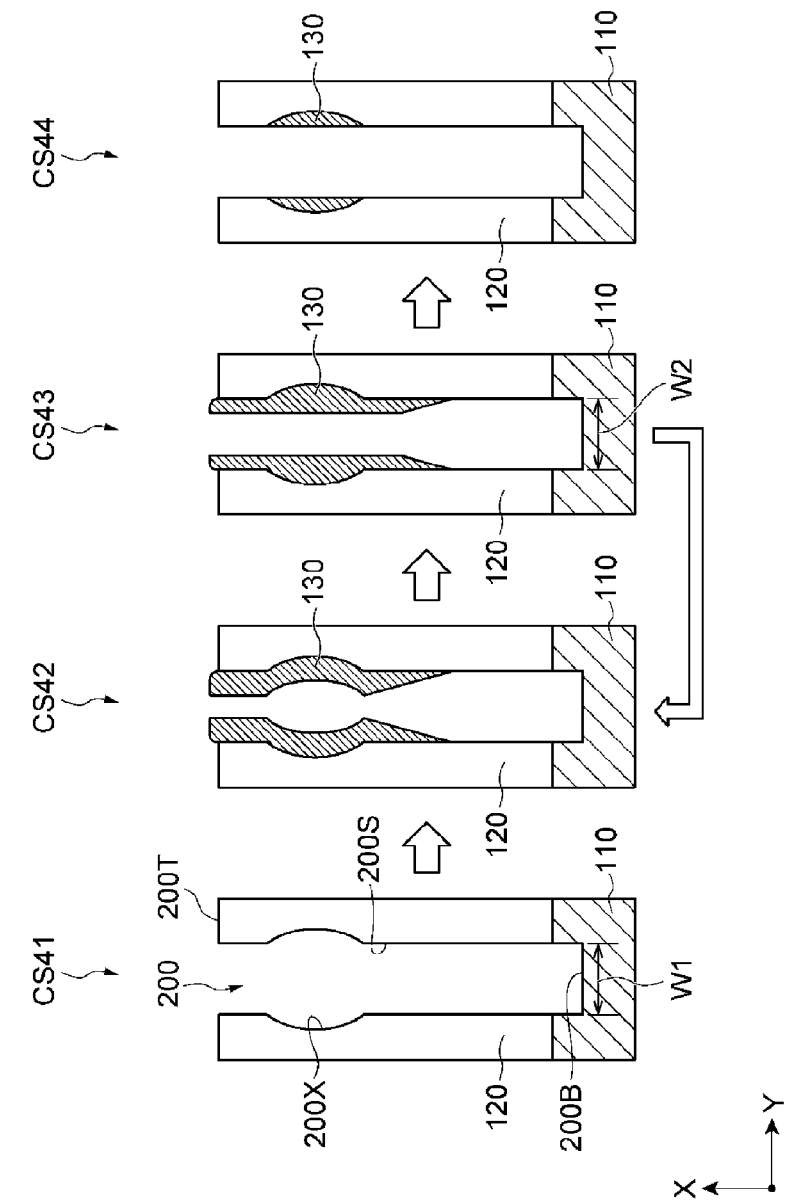
FIG. 10 illustrates a plurality of cross-sections of the substrate associated with performing the flowchart illustrated in FIG. 9.

Hereinafter, the method MT1 will be described in detail with reference to FIGS. 9 and 10. In FIG. 10, the X direction corresponds to the thickness direction of the substrate, and the Y direction corresponds to the area direction of the surface of the substrate.

A cross section CS41 illustrated in FIG. 10 is an example of a cross section in which a part of the substrate W to which the method MT1 is applicable is enlarged. A cross section CS42 illustrated in FIG. 10 is an example of a cross section in which a part of the substrate W after performing the step ST120 is enlarged.

A cross section CS43 illustrated in FIG. 10 is an example of a cross section in which a part of the substrate W after performing the step ST130 is enlarged. The cross section CS44 illustrated in FIG. 10 is an example of a cross section in which a part of the substrate W is enlarged when the answer to the step ST140 is "YES."

As illustrated in the cross section CS41, the substrate W has an etching film 110 (etching region) and a mask 120 (region) which is provided on the etching film 110 and patterned. An opening 200 is formed in the mask 120. The opening 200 has a top 200T, a side wall 200S, and a bottom 200B.

A shape abnormality 200X occurs on the side wall 200S of the opening 200. The opening OP has a high aspect ratio. For example, the aspect ratio of the opening 200 is 5 or more, or 10 or more.

First, a cross section CS41 is provided in the step ST110. In the step ST120 subsequent to the step ST110, as illustrated in the cross section CS42, the first film 130 is formed on the inner peripheral surface of the opening 200 (e.g., at least a part of the sidewall 200S including the shape abnormality 200X).

The first film 130 has different film thicknesses along a stacking direction of the mask 120 (X direction illustrated in FIG. 10). In other words, the film thickness of the first film 130 is sub-conformal along the stacking direction of the mask 120. For example, in the case of the cross section CS42 illustrated in FIG. 10, the first film 130 has a different film thickness depending on a distance from the top 200T of the mask 120, and the film thickness of the first film 130 gradually decreases toward the bottom 200B.

The first film 130 is mainly formed on the shape abnormality 200X. The first film 130 covers the shape abnormality 200X. The opening size of the opening 200 may be reduced by the film thickness of the first film 130 at the position of the shape abnormality 200X.

The first film 130 having the above-described shape may be formed using, for example, a chemical vapor deposition (CVD) or an atomic layer deposition (ALD). The film forming method in the step ST120 is not limited to the above.

In the step ST130 subsequent to the step ST120, the first film 130 is trimmed. The surface of the first film 130 is removed by trimming and becomes smoother along the stacking direction as illustrated in the cross section CS43. As compared with the cross section CS41, the cross section CS43 alleviates the shape abnormality 200X when the first film 130 is formed on the shape abnormality 200X.

In this way, a difference among the opening size at the position of the top 200T of the opening 200 before the step ST120, the opening size at the position of the shape abnormality 200X, and the opening size at the position of the bottom 200B decreases after the step ST130.

Further, as described above, in the step ST120, the film forming process is performed under the processing condition in which the film thickness of the first film 130 decreases from the top 200T to the bottom 200B. Therefore, the variation in the opening size of the bottom 200B between before the step ST120 and after the step ST130 is suppressed. For example, the opening size W1 of the bottom 200B in the cross section CS41 and the opening size W2 of the bottom 200B in the cross section CS43 are substantially the same.

Therefore, when the flowchart illustrated in FIG. 9 is performed, it is possible to correct a shape abnormality that may occur at a preset position in the stacking direction, such as bowing or necking, without changing the opening size of the bottom 200B of the opening 200.

In the step ST140 subsequent to the step ST120, it is determined whether the opening size of the opening 200 has reached a preset value. The phrase "the opening size has reached a preset value" means that, for example, a difference among the opening size of the top 200T of the opening 200, the opening size of a preset position of the side wall 200S (e.g., shape abnormality 200X), and the opening size of the bottom 200B falls within the preset value.

The determination in the step ST140 is performed based on, for example, the number of times of execution (number of cycles) of the steps ST120 and ST130. In the step ST140, whether the opening size has reached a preset value is determined by determining whether the number of cycles of the steps ST120 and ST130 has reached a preset number. The number of cycles of the step ST120 and the step ST130 performed until the opening size reaches a preset value is set in advance.

In the step ST140, when it is determined that the number of executions of the step ST120 and the step ST130 has reached the preset number, it is determined that the opening size has reached the preset value (step ST140: "YES").

In the step ST140, when it is determined that the number of executions of the steps ST120 and ST130 has not reached the preset number, it is determined that the opening size has not reached the preset value (step ST140: "NO"). In this case, the step ST120 and the step ST130 are performed again.

For example, when the state of the substrate W at the time of the determination in the step ST140 is a state illustrated in the cross section CS44, it is determined that the opening size has reached a preset value, and the process ends.

The material of the first film 130 may be the same as the material of the mask 120. The mask 120 may be, for example, a carbon-containing film, a silicon-containing film, or a metal film. Since the first film 130 and the mask 120 are formed of the same material, control may be facilitated in the process after the method MT1. For example, the etching rates of the first film 130 and the mask 120 may be matched during etching.

Therefore, the size of the bottom 200B of the opening 200 may be easily controlled during etching after the first film 130 is formed. Since the first film 130 and the mask 120 are formed of the same material, the amount removed by etching may be easily controlled.

For example, when the mask 120 is a carbon-containing film, the etching film 110 may be a silicon-containing film or a metal film.

The carbon-containing film may be, for example, an amorphous carbon layer (ALC). The silicon-containing film may be, for example, a silicon oxide film (SiO), a silicon nitride film (SiN), a silicon oxynitride film (SiON), or a combination thereof. The metal film is a titanium (Ti) film or a tungsten (W) film.

In addition, when the mask 120 is a silicon-containing film, the etching film 110 may be a carbon-containing film, a metal film, or a silicon-containing film having a different composition from the mask 120. Further, when the mask 120 is a metal film, the etching target film 110 may be a silicon-containing film or a carbon-containing film.

Also, the etching film 110 may be a stacked film in which a plurality of layers is stacked. For example, the etching film 110 may be an oxide/nitride (ONON) film or an oxide/polysilicon (OPOP) film.

Further, the step ST120 and the step ST130 may be alternately performed a plurality of times. For example, the step ST120 is continuously performed five times, and then the step ST120 may be performed once. For example, the step ST120 may be continuously performed 10 to 50 times, and then the step ST130 may be continuously performed twice.

Figure 11:
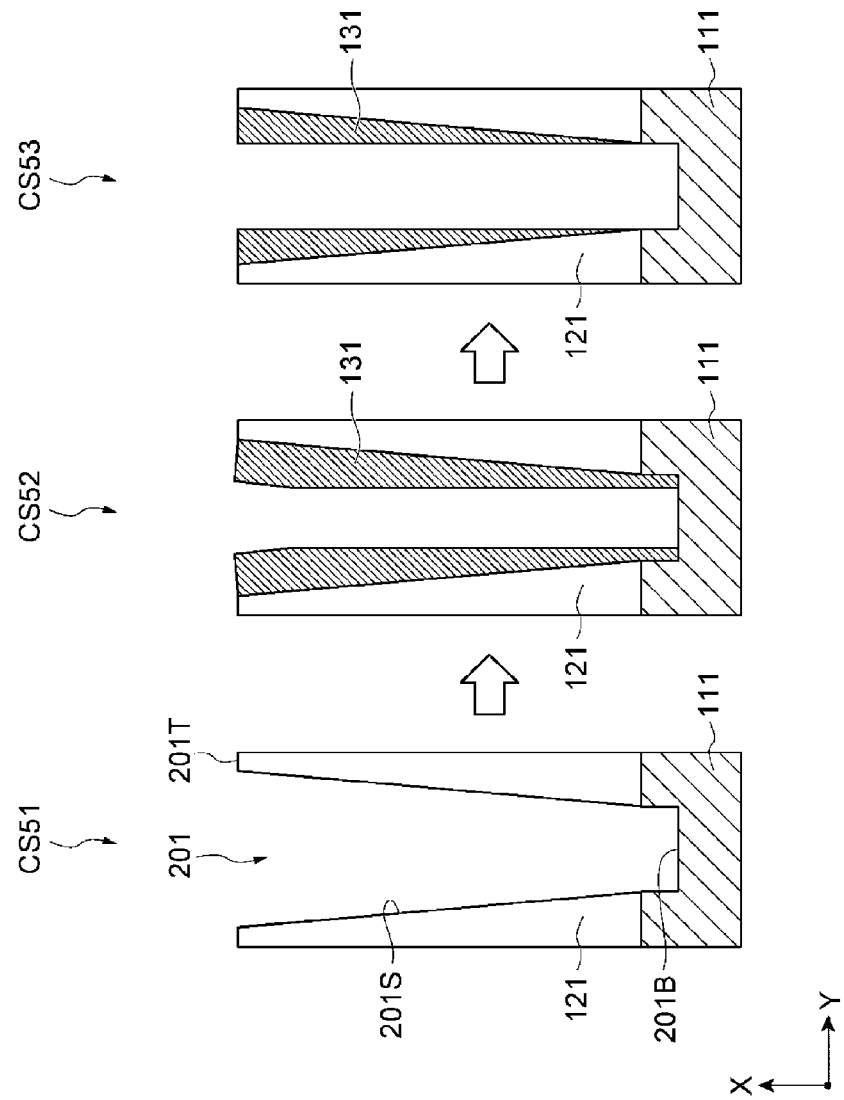
FIG. 11 illustrates a plurality of other cross-sections of the substrate associated with performing the flowchart illustrated in FIG. 9.

Next, the method MT1 will be further described with reference to FIG. 11. In the following descriptions, FIG. 9 will be referred together with FIG. 11. In FIG. 11, the X direction corresponds to the thickness direction of the substrate, and the Y direction corresponds to the area direction of the surface of the substrate.

A cross section CS51 illustrated in FIG. 11 is an example of a cross section in which a part of the substrate W which is provided in the step ST110 and to which the method MT1 is applicable is enlarged. A cross section CS52 illustrated in FIG. 11 is an example of a cross section in which a part of the substrate W after performing the step ST120 is enlarged. The cross section CS53 illustrated in FIG. 11 is an example of a cross section in which a part of the substrate W is enlarged when the answer to the step ST140 is "YES."

As illustrated in the cross section CS51, the substrate W has an etching film 111 (etching region) and a mask 121 (region) which is provided on the etching film 111 and patterned. The material of the etching film 111 may be the same as the material of the etching film 110.

An opening 201 is formed in the mask 121. The material of the mask 121 may be the same as the material of the mask 120. The opening 201 is tapered from the top 201T toward the bottom 201B. As illustrated in the cross section CS52, in the step ST120, the first film 131 having a different film thickness is formed on the sidewall 201S of the opening 201 along the stacking direction of the mask 121.

Thus, in the step ST120, the first film 131 is formed on the sidewall 201S (side surface) of the patterned mask 121. The material of the first film 131 may be the same as the material of the first film 130.

Since the shape of the inner peripheral surface (side wall 201S) of the opening 201 is corrected by the first film 131, the difference in opening size in the stacking direction (X direction) may be reduced by the film thickness of the first film 131.

In the step ST130 subsequent to the step ST120, the first film 130 is trimmed. The tapered shape in the opening 201 is alleviated by performing the step ST120 and the step ST130. Therefore, as illustrated in the cross section CS53, by repeating the step ST120 and the step ST130, the difference in opening size of the top 201T, the side wall 201S, and the bottom 201B may be reduced as compared with the difference in the opening size before the process. By repeating a cycle including the step ST120 and the step ST130, the difference in opening size in the stacking direction (X direction) may be reduced, and the shape of the mask 121 may be corrected.

Figure 12:
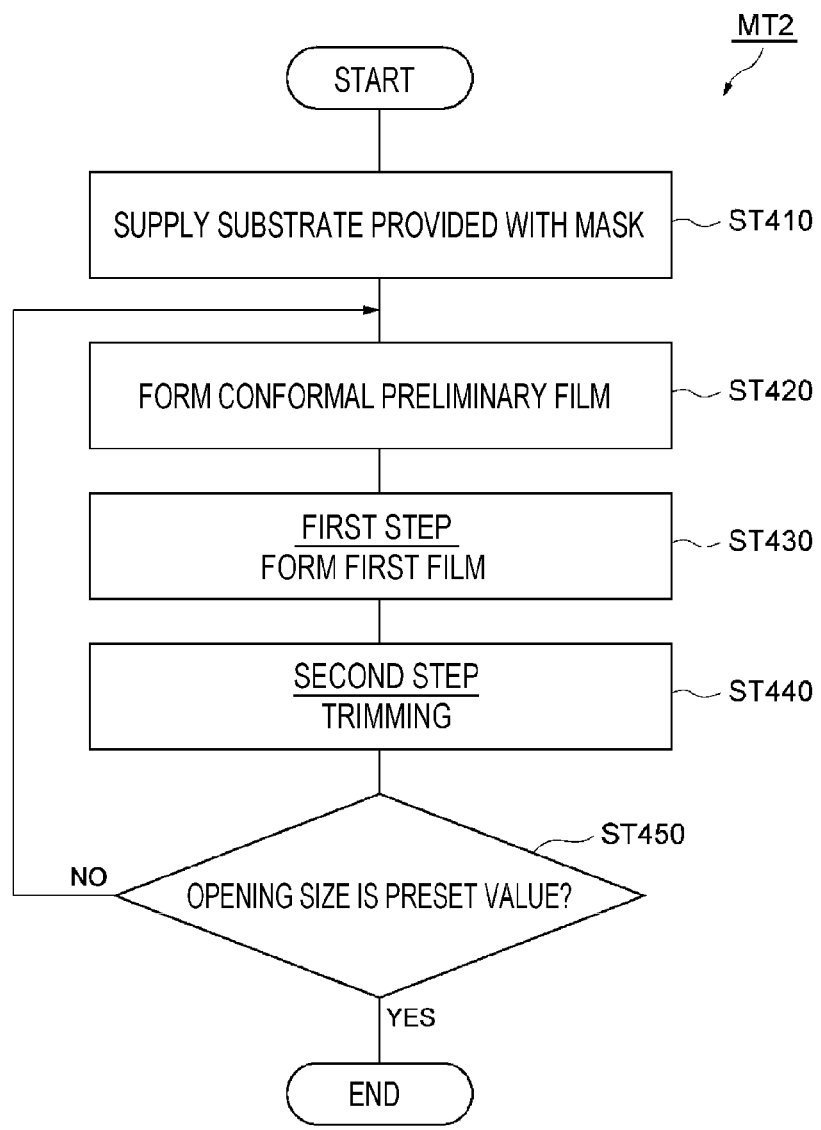
FIG. 12 is a flowchart according to another embodiment of the substrate processing method.

The flowchart illustrated in FIG. 12 represents another embodiment of a substrate processing method (hereinafter, referred to as a method MT2). The method MT2 includes, step ST410, step ST430 (first step), step ST440 (second step), and step ST450. The method MT2 may be performed using, for example, the plasma processing apparatus 1 illustrated in FIG. 2. In this case, the method MT2 may be performed by the controller 80 of the plasma processing apparatus 1.

First, in the step ST410, a substrate provided with a mask is provided in the internal space of the chamber. In the step ST420 subsequent to the step ST410, a preliminary film is formed on the inner peripheral surface of the opening provided in the mask. Unlike the first film 130 illustrated in FIG. 10, the preliminary film is formed over the entire opening. For example, the preliminary film may be a conformal film.

In the step ST430 subsequent to the step ST420, the first film is formed from above the preliminary film to the inner peripheral surface of the opening. The first film may be, for example, an organic film. That is, in the step ST430, the organic film is formed on the substrate. In the step ST430, the same process as the sequence including the step ST1 and the step STJ illustrated in FIG. 1 may be performed. In the method MT2, the first film has a different film thickness in the stacking direction of the mask, as in the first film in the method MT1.

In the step ST440 subsequent to the step ST430, the first film is trimmed. In the step ST450 subsequent to the step ST440, it is determined whether the opening size (CD) of the opening after trimming has a preset value. When it is determined in the step ST450 that the opening size of the opening after trimming has a preset value (step ST450: "YES"), the process ends.

When it is determined in the step ST450 that the opening size of the opening after trimming does not have a preset value (step ST450: "NO"), the processes of the steps ST420 to ST450 are repeated. In this way, a cycle including the step ST430 and the step ST440 is performed one or more times.

The method MT2 is different from the method MT1 in that the two types of films are formed on the mask and then trimming is performed. For example, when it is desired to suppress the CD increase of the bottom 200B and the bottom 201B (see FIGS. 10 and 11) due to the trimming (step ST130) in the method MT1, the method MT2 may be applied.

Figure 13:
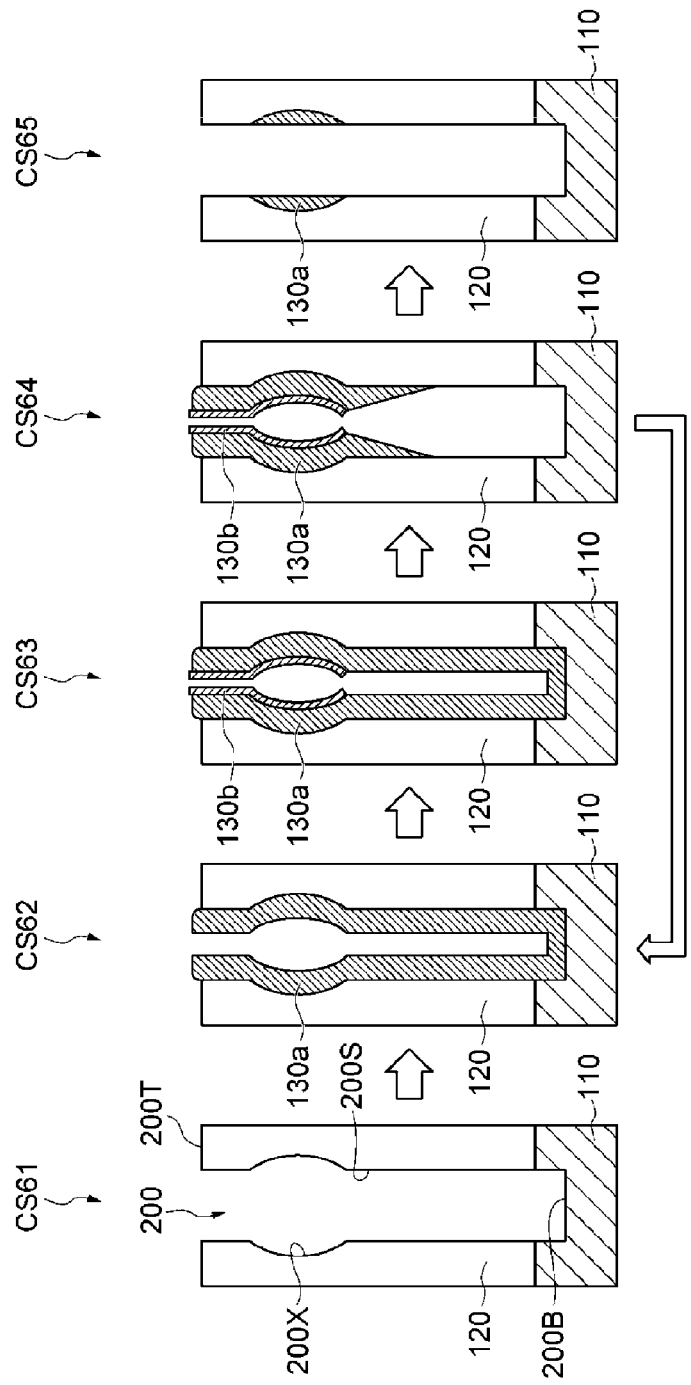
FIG. 13 illustrates a plurality of cross-sections of the substrate associated with performing the flowchart illustrated in FIG. 12.

Next, the method MT2 will be further described with reference to FIG. 13. In the following descriptions, FIG. 12 will be referred together with FIG. 13. In FIG. 13, the X direction corresponds to the thickness direction of the substrate, and the Y direction corresponds to the area direction of the surface of the substrate.

A cross section CS61 illustrated in FIG. 13 is an example of a cross section in which a part of the substrate W which is provided in the step ST410 and to which the method MT2 is applicable is enlarged. The shape of the cross section CS61 is the same as the shape of the cross section CS41 illustrated in FIG. 10. A cross section CS62 illustrated in FIG. 13 is an example of a cross section in which a part of the substrate W after performing the step ST420 is enlarged.

A cross section CS63 illustrated in FIG. 13 is an example of a cross section in which a part of the substrate W after performing the step ST430 is enlarged. A cross section CS64 illustrated in FIG. 13 is an example of a cross section in which a part of the substrate W after performing the step ST440 is enlarged. The cross section CS65 illustrated in FIG. 13 is an example of a cross section in which a part of the substrate W is enlarged when the answer to the step ST450 is "YES."

First, the cross section CS61 is provided in the step ST410. In the step ST420 subsequent to the step ST410, a preliminary film 130*a* is formed in the opening 200 as illustrated in the cross section CS62.

The preliminary film 130*a* is formed on the entire inner surface of the opening 200 (including the side wall 200S and the bottom 200B). Unlike the first film 130 illustrated in FIG. 10, the preliminary film 130*a* may not have a different film thickness along the stacking direction (X direction). That is, for example, the preliminary film 130*a* may have a conformal, uniform film thickness from the top 200T to the bottom 200B. The preliminary film 130*a* may be formed by, for example, ALD.

In the step ST430 subsequent to the step ST420, the first film 130*b* is formed on the preliminary film 130*a* as illustrated in the cross section CS63. Similarly to the first film 130 illustrated in FIG. 10, the first film 130*b* has different film thickness along the stacking direction of the mask 120. For example, the first film 130*b* is mainly formed on the shape abnormality 200X. The method of forming the first film 130*b* is the same as the method of forming the first film 130 illustrated in FIG. 10.

The material of the preliminary film 130*a* is the same as the material of the mask 120. The material of the first film 130*b* is the same as the material of the etching film 110. Further, a material is selected so that a high selectivity may be obtained between the material of the preliminary film 130*a* and the material of the first film 130*b*. This is because the trimming (step ST440) after the formation of the first film 130*b* is mainly performed under the processing condition capable of removing the preliminary film 130*a*.

By setting the processing conditions as described above, the preliminary film 130*a* formed on the portion other than the shape abnormality 200X may be favorably removed while leaving the first film 130*b* formed on the shape abnormality 200X. Therefore, while the shape abnormality 200X is being filled with the preliminary film 130*a*, the variation in the opening size of other portions in the opening 200 may be suppressed.

In the step ST440 subsequent to the step ST430, the inside of the opening 200 is trimmed as illustrated in the cross section CS64. In the example of the cross section CS64, the preliminary film 130*a* on the lower portion and the bottom 200B of the sidewall 200S of the opening 200 is removed, and the preliminary film 130*a* and the first film 130*b* are left from the shape abnormality 200X to the top 200T. In this way, the shape of the mask may be suitably corrected by the method MT2.

Also, in the method MT2, the steps ST420, ST430, and ST440 may be repeatedly performed until the opening size of the opening 200 reaches a preset value. For example, each of the steps may be repeatedly performed until a difference in the opening size among the top 200T, the side wall 200S, and the bottom 200B of the opening 200 reaches a preset value.

The cross section CS65 represents a state of the substrate W when the shape of the mask pattern (opening 200) is corrected and the opening size reaches a preset value. Further, the shape of the cross section CS65 may be implemented by further etching after the step ST450.

Figure 14:
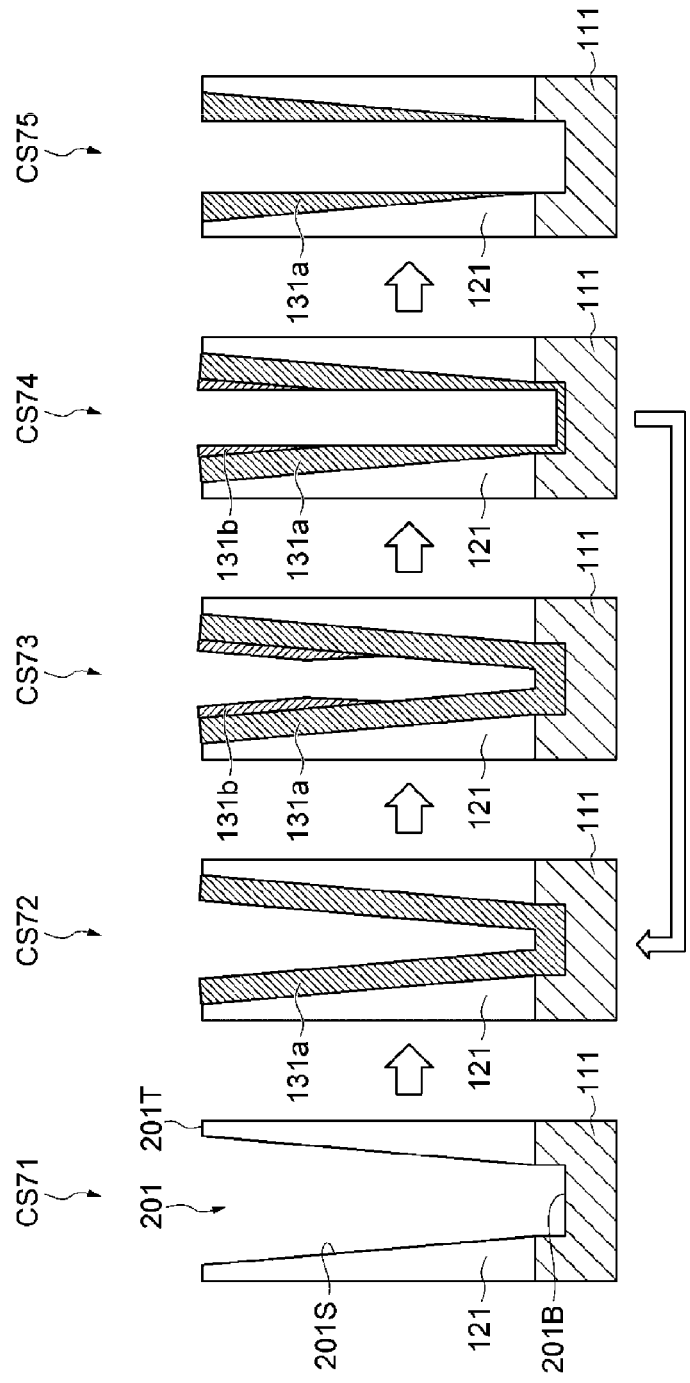
FIG. 14 illustrates a plurality of other cross-sections of the substrate associated with performing the flowchart illustrated in FIG. 12.

Next, the method MT2 will be further described with reference to FIG. 14. In the following descriptions, FIG. 12 will be referred together with FIG. 14. In FIG. 14, the X direction corresponds to the thickness direction of the substrate, and the Y direction corresponds to the area direction of the surface of the substrate.

A cross section CS71 illustrated in FIG. 14 is an example of a cross section in which a part of the substrate W which is provided in the step ST410 and to which the method MT2 is applicable is enlarged. The shape of the cross section CS71 is the same as the shape of the cross section CS51 illustrated in FIG. 11. A cross section CS72 illustrated in FIG. 14 is an example of a cross section in which a part of the substrate W after performing the step ST420 is enlarged.

A cross section CS73 illustrated in FIG. 14 is an example of a cross section in which a part of the substrate W after performing the step ST430 is enlarged. A cross section CS74 illustrated in FIG. 14 is an example of a cross section in which a part of the substrate W after performing the step ST440 is enlarged. The cross section CS75 illustrated in FIG. 14 is an example of a cross section in which a part of the substrate W is enlarged when the answer to the step ST450 is "YES."

In the example of FIG. 14, as in FIG. 13, in the step 420, a conformal preliminary film 131a is formed over the entire opening 201 before the step ST430, as illustrated in the cross section CS72. In the step ST430 subsequent to the step ST420, as illustrated in the cross section CS73, the first film 131b having a different film thickness is formed on the preliminary film 131a along the stacking direction (X direction).

In the step ST440 subsequent to the step ST430, trimming is performed. In this case, as illustrated in the cross section CS74, the preliminary film 131a is removed in the vicinity of the bottom 201B, and the remaining preliminary film 131a and the first film 131b reduce the taper in the opening 201 (the taper shape is alleviated). Therefore, by repeating the steps ST420 to ST440, the taper of the opening 201 may be appropriately corrected as illustrated in the cross section CS75.

As described above, the method MT2 further includes the step ST420 which is performed before the step ST430 and forms the conformal preliminary film in the opening. Therefore, according to the method MT2, the shape of the mask may be corrected while adjusting the opening size of the mask.

Further, in the method MT2, the material of the preliminary film and the material of the first film may have different etching selection ratios from each other. For example, the materials of the preliminary film and the first film may be selected such that the amount of the preliminary film removed by trimming in the step ST440 becomes larger than the amount of the first film. By doing so, the correction effect by trimming may be improved.

Further, in the method MT2, the material of the preliminary film may be the same as the material of the mask, and the material of the first film may be the same as the material of the etching film under the mask. For this reason, when etching is performed under etching conditions according to the mask, the first film may be left, and the shape of the mask may be corrected efficiently.

Although various embodiments have been described above, the present disclosure is not limited to the embodiments described above, and various omissions, substitutions, and changes may be made. In addition, it is possible to combine the elements in other embodiments to form other embodiments.

For example, the methods MT, MT1, and MT2 may be performed using a plasma processing apparatus other than the plasma processing apparatus 1. Examples of such a plasma processing apparatus may include an inductively coupled plasma processing apparatus and a plasma processing apparatus that generates plasma by surface waves such as microwaves.

In addition, the step of forming an organic film (the step ST1, the step ST120, the step ST420, and the step ST430) and the step of etching (the step ST12, the step ST130, and the step ST440) may be performed in the same chamber (in-situ) while maintaining a reduced pressure atmosphere. In addition, the step of forming an organic film (the step ST1, the step ST120, the step ST420, and the step ST430) and the step of etching (the step ST12, the step ST130, and the step ST440) may be performed in the same system (in-system).

According to the present disclosure, a technique for forming an organic film may be provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for processing a substrate comprising:
   (a) providing a substrate having an etching region and a patterned region on the etching region;
   (b) forming an organic film on a surface of the substrate; and
   (c) etching the etching region using plasma generated from a processing gas through the patterned region,
   wherein (b) includes:
      (b1) supplying a first gas containing an organic compound to the substrate to form a precursor layer on the substrate; and
      (b2) supplying a second gas containing a modifying gas to the substrate and supplying energy to the precursor layer and/or the second gas such that the precursor layer is modified to form the organic film, and
      wherein in (b2), the precursor layer is modified by plasma generated from the second gas.

2. The method for processing a substrate according to claim 1, wherein (b1) and (b2) are alternately repeated.

3. The method for processing a substrate according to claim 1, further comprising:
   (d) etching the organic film on the etching region such that the organic film is left in a portion along a side surface of the patterned region, before (c).

4. The method for processing a substrate according to claim 1, further comprising:
   (e) forming a recess by partially etching an etching region of the substrate through the patterned region using plasma generated from a processing gas before (b), wherein in (b), the organic film is formed at least on a side surface of the recess, and in (c), a bottom of the recess in the etching region is etched.

5. The method for processing a substrate according to claim 4, wherein in (b1), the precursor layer is formed on a portion of a surface of the recess and/or in (b2), the precursor layer is modified on a portion of the surface of the recess.

6. The method for processing a substrate according to claim 5, wherein the organic film has a different thickness along a thickness direction of the substrate.

7. The method for processing a substrate according to claim 1, further comprising:
(f) trimming the organic film after (b),
wherein the etching region is surrounded by a side surface of the patterned region, and
in (b), the organic film is formed on the side surface to have a different thickness along a thickness direction of the substrate.

8. The method for processing a substrate according to claim 7, further comprising:
(g) forming a conformal organic film on the entire side surface before (b).

9. The method for processing a substrate according to claim 1, wherein the first gas contains at least one organic compound selected from a group consisting of epoxides, carboxylic acids, carboxylic acid halides, carboxylic acid anhydrides, isocyanates, and phenols.

10. The method for processing a substrate according to claim 1, wherein when the first gas contains at least one organic compound selected from the group consisting of carboxylic acids, carboxylic acid halides, and isocyanates, the second gas contains at least one modifying gas selected from the group consisting of an inorganic compound gas having an NH bond, an inert gas, a mixed gas of $N_2$ and $H_2$, $H_2O$ gas, and a mixed gas of $H_2$ and $O_2$.

11. The method for processing a substrate according to claim 1, wherein when the first gas contains at least one organic compound selected from a group consisting of epoxides, carboxylic acid anhydrides, and phenols, the second gas contains at least one modifying gas selected from a group consisting of an inorganic compound gas having an NH bond, an inert gas, and a mixed gas of $N_2$ and $H_2$.

12. The method for processing a substrate according to claim 11, wherein the inorganic compound gas having an NH bond is at least one selected from a group consisting of $N_2H_2$, $N_2H_4$, and $NH_3$.

13. The method for processing a substrate according to claim 1, wherein the etching region includes a silicon-containing film.

14. The method for processing a substrate according to claim 1, wherein the forming of the organic film and the etching are performed in a same processing chamber (in-situ) or a same system (in-system) while maintaining a reduced pressure atmosphere.

15. The method for processing a substrate according to claim 1, wherein in (b2), a thickness of the etching region of the substrate remains substantially the same.

16. A method for processing a substrate comprising:
(a) providing a substrate having an etching region and a patterned region on the etching region;
(b) forming an organic film on a surface of the substrate; and
(c) etching the etching region using plasma generated from a processing gas through the patterned region,
wherein (b) includes:
(b1) supplying a first gas containing an organic compound to the substrate to form a precursor layer on the substrate; and
(b2) supplying a second gas containing a modifying gas to the substrate and supplying energy to the precursor layer and/or the second gas such that the precursor layer is modified to form the organic film, and
wherein the second gas contains at least one modifying gas selected from a group consisting of an inorganic compound gas having an NH bond, an inert gas, a mixed gas of $N_2$ and $H_2$, $H_2O$ gas, and a mixed gas of $H_2$ and $O_2$.

* * * * *